United States Patent
Hirakawa

(10) Patent No.: US 11,705,438 B2
(45) Date of Patent: Jul. 18, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Tatsuya Hirakawa, Takasago Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 6 days.

(21) Appl. No.: 17/468,174

(22) Filed: Sep. 7, 2021

(65) Prior Publication Data

US 2022/0093572 A1  Mar. 24, 2022

(30) Foreign Application Priority Data

Sep. 18, 2020 (JP) ................................. 2020-157060

(51) Int. Cl.
*H01L 25/07* (2006.01)
*H01L 23/00* (2006.01)
(Continued)

(52) U.S. Cl.
CPC .......... *H01L 25/072* (2013.01); *H01L 23/049* (2013.01); *H01L 23/3735* (2013.01); *H01L 24/48* (2013.01); *H01L 2224/48225* (2013.01); *H01L 2924/13091* (2013.01); *H01L 2924/14252* (2013.01); *H01L 2924/15787* (2013.01);
(Continued)

(58) Field of Classification Search
None
See application file for complete search history.

(56) References Cited

U.S. PATENT DOCUMENTS

| 2013/0020725 A1 | 1/2013 | Onishi et al. |
| 2015/0155797 A1* | 6/2015 | Okayama ............. H01L 25/072 |
| | | 363/131 |

(Continued)

FOREIGN PATENT DOCUMENTS

| CN | 102859671 | 1/2013 |
| JP | 2011-249394 A | 12/2011 |

(Continued)

*Primary Examiner* — Michelle Mandala
*Assistant Examiner* — Jordan M Klein
(74) *Attorney, Agent, or Firm* — Allen & Overy LLP

(57) ABSTRACT

A semiconductor device of embodiments includes an insulating substrate, a first main terminal, a second main terminal, an output terminal, a first metal layer connected to the first main terminal, a second metal layer connected to the second main terminal, a third metal layer disposed between the first metal layer and the second metal layer and connected to the output terminal, a first semiconductor chip and a second semiconductor chip provided on the first metal layer, a third semiconductor chip and a fourth semiconductor chip provided on the third metal layer, and a conductive member on the second metal layer. Then, the second metal layer includes a slit. The conductive member is provided between the end portion of the second metal layer and the slit.

10 Claims, 18 Drawing Sheets

(51) Int. Cl.
    *H01L 23/049*     (2006.01)
    *H01L 23/373*     (2006.01)

(52) U.S. Cl.
    CPC ............... *H01L 2924/16152* (2013.01); *H01L 2924/30107* (2013.01)

(56) References Cited

U.S. PATENT DOCUMENTS

| | | | |
|---|---|---|---|
| 2017/0154877 A1* | 6/2017 | Tanimoto | H01L 23/3735 |
| 2020/0365564 A1* | 11/2020 | Mari Curbelo | H01L 23/5386 |
| 2021/0099071 A1 | 4/2021 | Otake | |
| 2021/0351161 A1* | 11/2021 | Iguchi | H01L 25/0655 |

FOREIGN PATENT DOCUMENTS

| | | |
|---|---|---|
| JP | 2013-157394 A | 8/2013 |
| JP | 2015-053410 A | 3/2015 |
| WO | 2012-073572 A1 | 6/2012 |
| WO | 2019-163343 A1 | 8/2019 |

\* cited by examiner

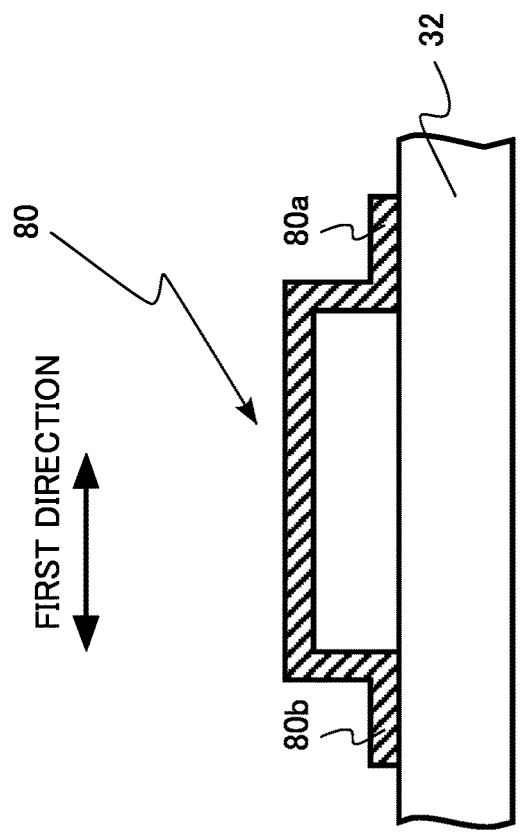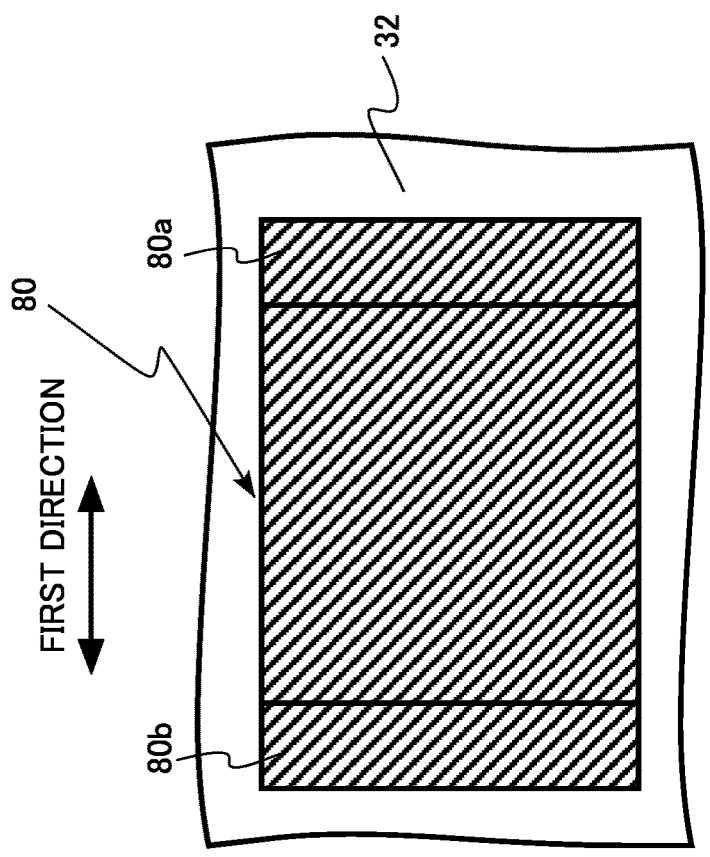

SEMICONDUCTOR DEVICE

CROSS-REFERENCE TO RELATED APPLICATION

This application is based upon and claims the benefit of priority from Japanese Patent Application No. 2020-157060, filed on Sep. 18, 2020, the entire contents of which are incorporated herein by reference.

FIELD

Embodiments described herein relate generally to a semiconductor device.

BACKGROUND

In a power semiconductor module, for example, a power semiconductor chip is mounted on a metal base with an insulating substrate interposed therebetween. The power semiconductor chip is, for example, a metal oxide field effect transistor (MOSFET). In the power semiconductor module, in order to reduce the power consumption, it is desired to reduce the switching loss by shortening the switching time. In addition, in the power semiconductor module, it is desired to reduce the steady loss by reducing the electrical resistance of the current path.

BRIEF DESCRIPTION OF THE DRAWINGS

FIGS. 8A and 8B are schematic diagrams of a conductive member of the semiconductor device of the second embodiment.

DETAILED DESCRIPTION

Figure 1:
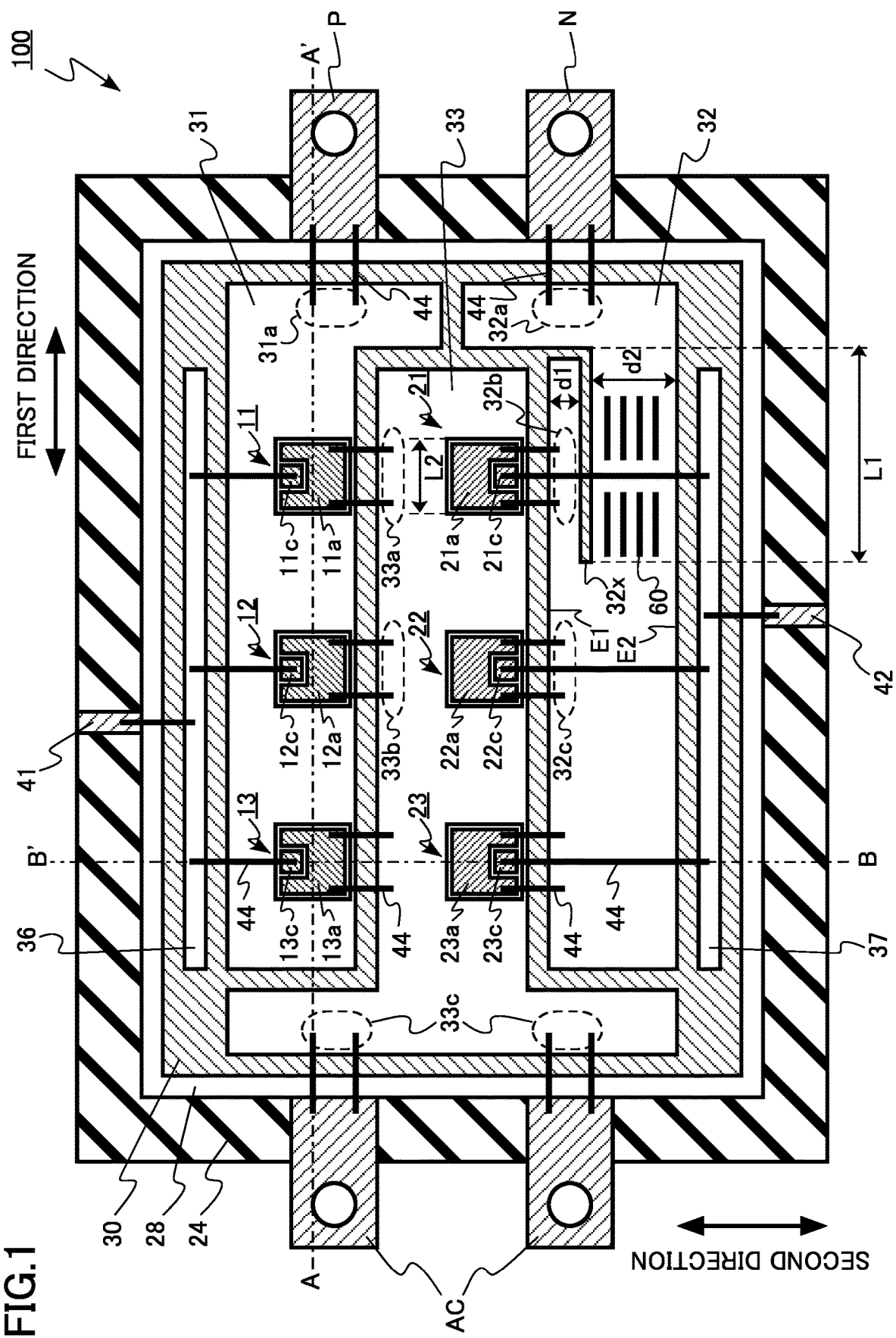
FIG. 1 is a schematic top view of a semiconductor device of a first embodiment.

A semiconductor device of embodiments includes: an insulating substrate having one end and the other end on a side opposite to the one end; a first main terminal provided on a side of the one end; a second main terminal provided on the side of the one end; an output terminal provided on a side of the other end; a first metal layer provided on the insulating substrate, the first metal layer having a first region, and electrically connected to the first main terminal in the first region; a second metal layer provided on the insulating substrate, the second metal layer having a second region, a third region, and a fourth region, and electrically connected to the second main terminal in the second region; a third metal layer provided on the insulating substrate, the third metal layer disposed between the first metal layer and the second metal layer, the third metal layer having a fifth region, a sixth region, and a seventh region, and electrically connected to the output terminal in the seventh region; a first semiconductor chip including a first upper electrode, a first lower electrode, and a first gate electrode and provided on the first metal layer, the first upper electrode being electrically connected to the fifth region and the first lower electrode being electrically connected to the first metal layer; a second semiconductor chip including a second upper electrode, a second lower electrode, and a second gate electrode and provided on the first metal layer, the second upper electrode being electrically connected to the sixth region, the second lower electrode being electrically connected to the first metal layer, and a distance of the second semiconductor chip from the first region being longer than a distance of the first semiconductor chip from the first region; a third semiconductor chip including a third upper electrode, a third lower electrode, and a third gate electrode and provided on the third metal layer, the third upper electrode being electrically connected to the third region and the third lower electrode being electrically connected to the third metal layer; a fourth semiconductor chip including a fourth upper electrode, a fourth lower electrode, and a fourth gate electrode and provided on the third metal layer, the fourth upper electrode being electrically connected to the fourth region, the fourth lower electrode being electrically connected to the third metal layer, and a distance of the fourth semiconductor chip from the fifth region being longer than a distance of the third semiconductor chip from the fifth region; and a conductive member, at least a first portion on a side of the second main terminal and a second portion on a side of the output terminal being electrically connected to the second metal layer, wherein the second metal layer has a first end portion on a side facing the third metal layer and a second end portion on a side opposite to the first end portion and includes a slit disposed between the third region and the second end portion, and the conductive member is provided at a position at least between the slit and the first end portion or between the slit and the second end portion.

In this specification, the same or similar members are denoted by the same reference numerals, and the repeated descriptions thereof will may be omitted.

In this specification, in order to show the positional relationship of components and the like, the upper direction of the diagram may be described as "upper" and the lower direction of the diagram may be described as "lower". In this specification, the concepts of "upper" and "lower" do not necessarily indicate the relationship with the direction of gravity.

First Embodiment

A semiconductor device of a first embodiment includes: an insulating substrate having one end and the other end on a side opposite to the one end; a first main terminal provided on a side of the one end; a second main terminal provided on the side of the one end; an output terminal provided on a side of the other end; a first metal layer provided on the insulating substrate, having a first region, and electrically connected to the first main terminal in the first region; a second metal layer provided on the insulating substrate, having a second region, a third region, and a fourth region, and electrically connected to the second main terminal in the second region; a third metal layer provided on the insulating substrate, disposed between the first metal layer and the second metal layer, having a fifth region, a sixth region, and a seventh region, and electrically connected to the output terminal in the seventh region; a first semiconductor chip including a first upper electrode, a first lower electrode, and a first gate electrode and provided on the first metal layer, the first upper electrode being electrically connected to the fifth region and the first lower electrode being electrically connected to the first metal layer; a second semiconductor chip including a second upper electrode, a second lower electrode, and a second gate electrode and provided on the first metal layer, the second upper electrode being electrically connected to the sixth region, the second lower electrode being electrically connected to the first metal layer, and a distance of the second semiconductor chip from the first region being longer than a distance of the first semiconductor chip from the first region; a third semiconductor chip including a third upper electrode, a third lower electrode, and a third gate electrode and provided on the third metal layer, the third upper electrode being electrically connected to the third region and the third lower electrode being electrically connected to the third metal layer; a fourth semiconductor chip including a fourth upper electrode, a fourth lower electrode, and a fourth gate electrode and provided on the third metal layer, the fourth upper electrode being electrically connected to the fourth region, the fourth lower electrode being electrically connected to the third metal layer, and a distance of the fourth semiconductor chip from the fifth region being longer than a distance of the third semiconductor chip from the fifth region; and a conductive member, at least a first portion on a side of the second main terminal and a second portion on a side of the output terminal being electrically connected to the second metal layer. The second metal layer has a first end portion on a side facing the third metal layer and a second end portion on a side opposite to the first end portion and includes a slit disposed between the third region and the second end portion. The conductive member is provided at a position at least between the slit and the first end portion or between the slit and the second end portion.

Figure 2:
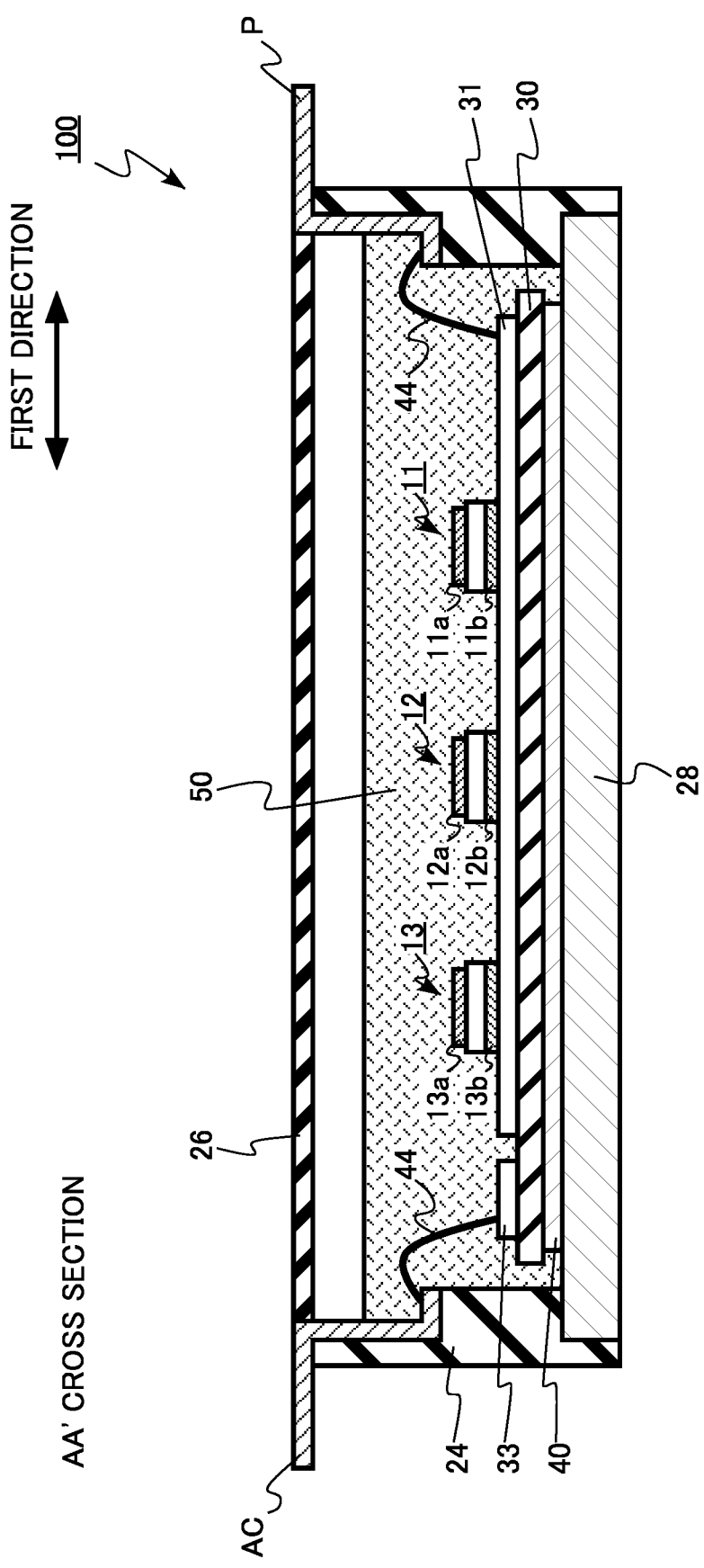
FIG. 2 is a schematic cross-sectional view of the semiconductor device of the first embodiment.
Figure 3:
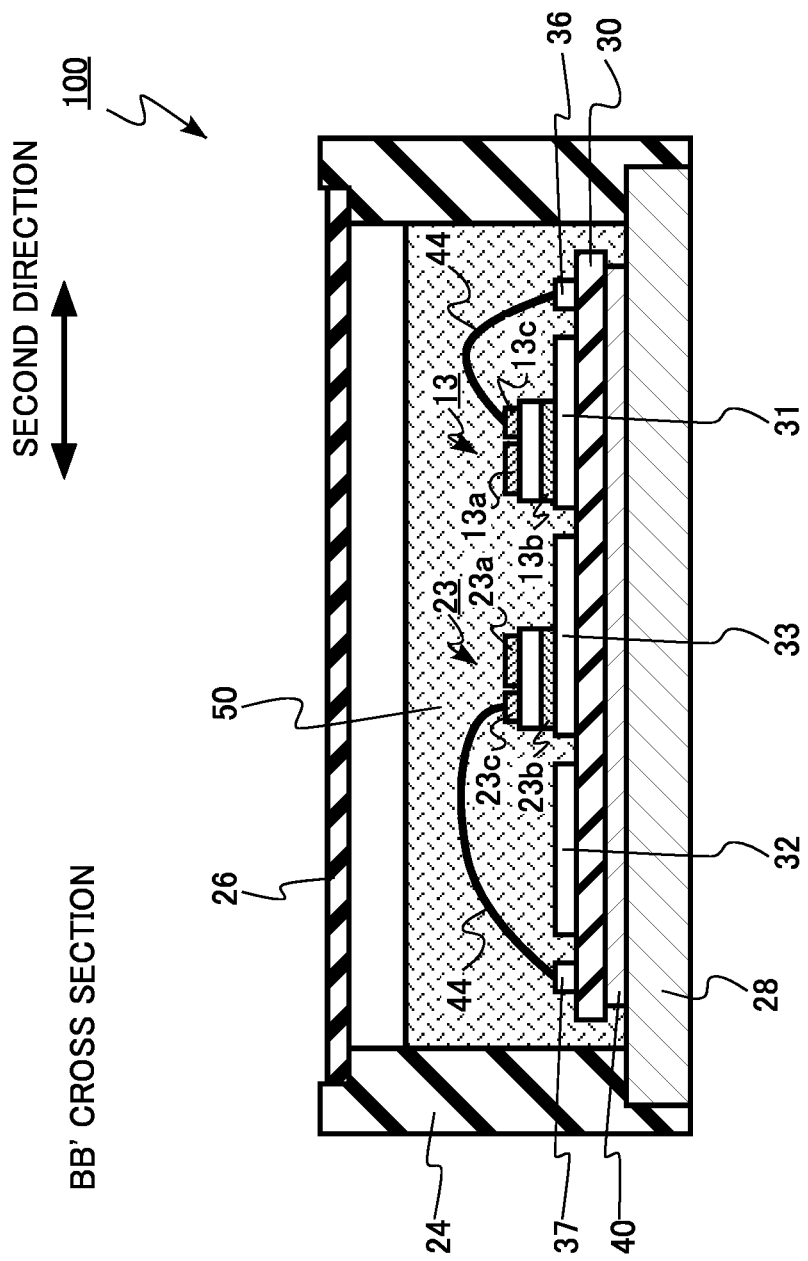
FIG. 3 is a schematic cross-sectional view of the semiconductor device of the first embodiment.
Figure 4:
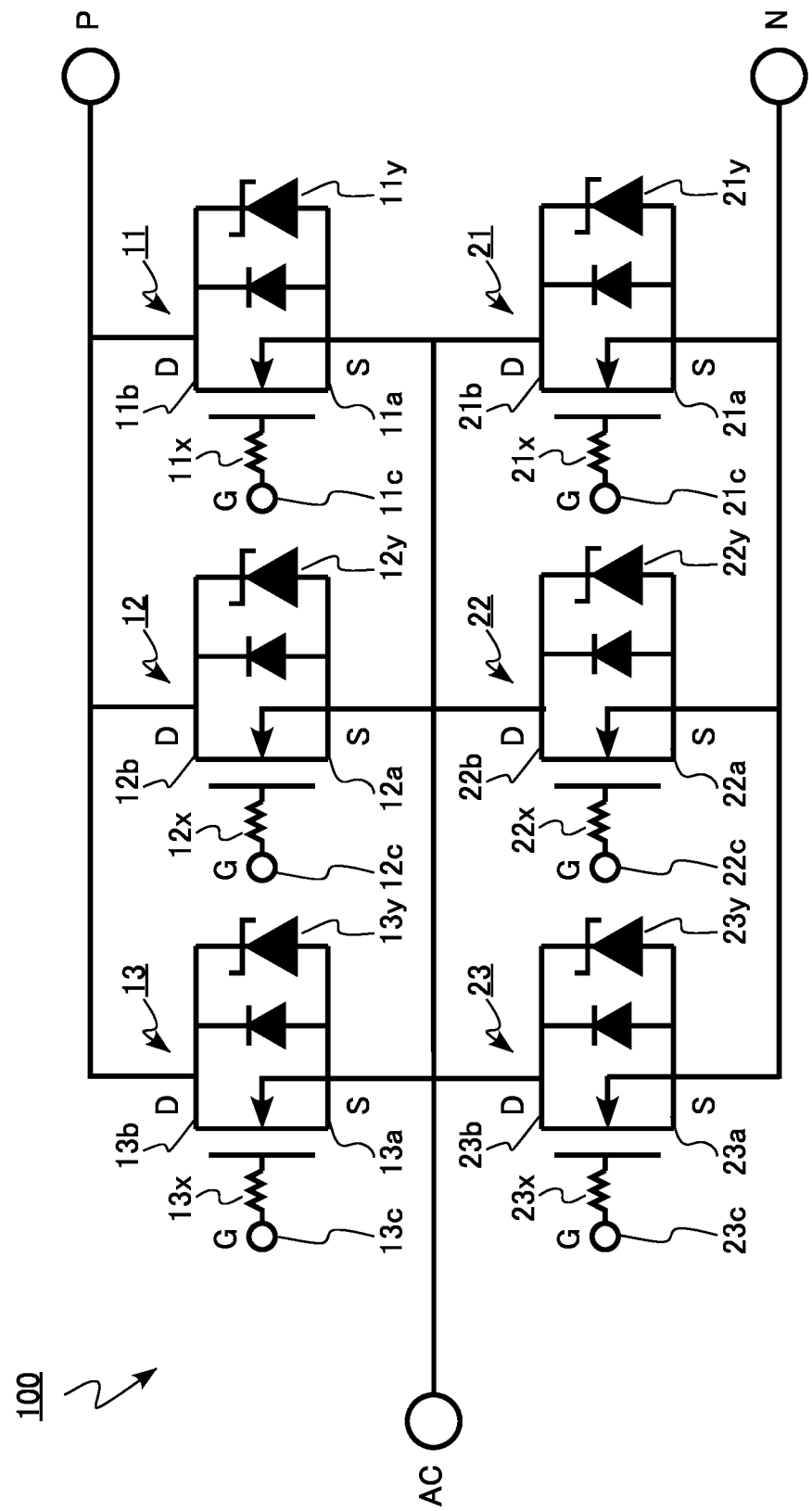
FIG. 4 is an equivalent circuit diagram of the semiconductor device of the first embodiment.

FIG. 1 is a schematic top view of a semiconductor device of a first embodiment. FIG. 2 is a schematic cross-sectional view of the semiconductor device of the first embodiment. FIG. 2 is a cross-sectional view taken along the line AA' of FIG. 1. FIG. 3 is a schematic cross-sectional view of the semiconductor device of the first embodiment. FIG. 3 is a cross-sectional view taken along the line BB' of FIG. 1. FIG. 4 is an equivalent circuit diagram of the semiconductor device of the first embodiment.

The semiconductor device of the first embodiment is a power semiconductor module 100. As shown in FIG. 4, the power semiconductor module 100 of the first embodiment is a so-called "2in1" type module in which a half-bridge circuit can be configured by one module. In the power semiconductor module 100, three half-bridge units are connected in parallel to each other. For example, a three-phase inverter circuit can be configured by using three power semiconductor modules of the first embodiment.

As shown in FIG. 4, the power semiconductor module 100 includes a positive terminal P (first main terminal), a negative terminal N (second main terminal), an AC output terminal AC (output terminal), a high side MOSFET 11, a high side MOSFET 12, a high side MOSFET 13, a low side MOSFET 21, a low side MOSFET 22, and a low side MOSFET 23. Each MOSFET includes a built-in Schottky barrier diode (SBD) in addition to a pn junction diode. The SBD has, for example, a function of allowing a reflux current to flow therethrough. In addition, each MOSFET includes a built-in gate resistor.

The high side MOSFET 11, the high side MOSFET 12, and the high side MOSFET 13 are connected in parallel to each other. The low side MOSFET 21, the low side MOSFET 22, and the low side MOSFET 23 are connected in parallel to each other. The high side MOSFET 11 and the low side MOSFET 21 are connected in series to each other, the high side MOSFET 12 and the low side MOSFET 22 are connected in series to each other, and the high side MOSFET 13 and the low side MOSFET 23 are connected in series to each other.

As shown in FIGS. 1, 2, and 3, the power semiconductor module 100 of the first embodiment includes the positive terminal P (first main terminal), the negative terminal N (second main terminal), the AC output terminal AC (output terminal), the high side MOSFET 11 (first semiconductor chip), the high side MOSFET 12 (second semiconductor chip), the high side MOSFET 13, the low side MOSFET 21 (third semiconductor chip), the low side MOSFET 22 (fourth semiconductor chip), the low side MOSFET 23, a resin case 24, a lid 26, a metal base 28, an insulating substrate 30, a first metal layer 31, a second metal layer 32, a third metal layer 33, a first gate metal layer 36, a second gate metal layer 37, a back surface metal layer 40, a first gate terminal 41, a second gate terminal 42, a bonding wire 44, a sealing resin 50, and a resistance-reducing bonding wire 60 (conductive member).

The high side MOSFET 11 (first semiconductor chip) includes a source electrode 11a (first upper electrode), a drain electrode 1ib (first lower electrode), a gate electrode 11c (first gate electrode), a gate resistor 11x (first gate resistor), and a Schottky barrier diode 11y (first Schottky barrier diode). The high side MOSFET 12 (second semiconductor chip) includes a source electrode 12a (second upper electrode), a drain electrode 12b (second lower electrode), a gate electrode 12c (second gate electrode), a gate resistor 12x (second gate resistor), and a Schottky barrier diode 12y (second Schottky barrier diode). The high side MOSFET 13 includes a source electrode 13a, a drain electrode 13b, a gate electrode 13c, a gate resistor 13x, and a Schottky barrier diode 13y.

The low side MOSFET 21 (third semiconductor chip) includes a source electrode 21a (third upper electrode), a drain electrode 21b (third lower electrode), a gate electrode 21c (third gate electrode), a gate resistor 21x (third gate resistor), a Schottky barrier diode 21y (third Schottky barrier diode). The low side MOSFET 22 (fourth semiconductor chip) includes a source electrode 22a (fourth upper electrode), a drain electrode 22b (fourth lower electrode), a gate electrode 22c (fourth gate electrode), a gate resistor 22x (fourth gate resistor), and a Schottky barrier diode 22y (fourth Schottky barrier diode). The low side MOSFET 23 includes a source electrode 23a, a drain electrode 23b, a gate electrode 23c, a gate resistor 23x (first gate resistor), and a Schottky barrier diode 23y (first Schottky barrier diode).

The first metal layer 31 includes a first region 31a. The second metal layer 32 includes a second region 32a, a third region 32b, a fourth region 32c, a slit 32x, a first end portion E1, and a second end portion E2. The third metal layer 33 includes a fifth region 33a, a sixth region 33b, and a seventh region 33c.

FIG. 1 is a top view of the power semiconductor module 100 in a state in which the lid 26 and the sealing resin 50 are removed.

The metal base 28 is, for example, copper. For example, when the power semiconductor module 100 is mounted on a product, a heat sink (not shown) is connected to the back surface of the metal base 28.

The insulating substrate 30 is provided on the metal base 28. The insulating substrate 30 is provided between the metal base 28 and the high side MOSFET 11, between the metal base 28 and the high side MOSFET 12, between the metal base 28 and the high side MOSFET 13, between the metal base 28 and the low side MOSFET 21, between the metal base 28 and the low side MOSFET 22, and between the metal base 28 and the low side MOSFET 23.

The insulating substrate 30 has a function of electrically separating the metal base 28 and the high side MOSFET 11 from each other, electrically separating the metal base 28 and the high side MOSFET 12 from each other, electrically separating the metal base 28 and the high side MOSFET 13 from each other, electrically separating the metal base 28 and the low side MOSFET 21 from each other, electrically separating the metal base 28 and the low side MOSFET 22 from each other, and electrically separating the metal base 28 and the low side MOSFET 23 from each other.

The insulating substrate 30 is, for example, ceramic. The insulating substrate 30 is, for example, aluminum oxide, aluminum nitride, or silicon nitride.

The first metal layer 31, the second metal layer 32, the third metal layer 33, the first gate metal layer 36, and the second gate metal layer 37 are provided on the surface of the insulating substrate 30. The first metal layer 31, the second metal layer 32, the third metal layer 33, the first gate metal layer 36, and the second gate metal layer 37 are, for example, copper.

A back surface metal layer 40 is provided on the back surface of the insulating substrate 30. The back surface metal layer 40 is, for example, copper. The back surface metal layer 40 is bonded to the metal base 28 by using, for example, a solder layer or a silver nanoparticle layer (not shown).

The resin case 24 is provided around the metal base 28 and the insulating substrate 30. A part of the resin case 24 is provided on the metal base 28. The resin case 24 has a function of protecting the high side MOSFET 11, the high side MOSFET 12, the high side MOSFET 13, the low side MOSFET 21, the low side MOSFET 22, the low side MOSFET 23, and the insulating substrate 30.

The lid 26 is provided on the resin case 24. The lid 26 has a function of protecting the high side MOSFET 11, the high side MOSFET 12, the high side MOSFET 13, the low side MOSFET 21, the low side MOSFET 22, the low side MOSFET 23, and the insulating substrate 30.

The high side MOSFET 11 is provided on the first metal layer 31. The high side MOSFET 11 includes the source electrode 11a, the drain electrode 11b, the gate electrode 11c, the gate resistor 11x, and the Schottky barrier diode 11y. The source electrode 11a is an example of the first upper electrode. The drain electrode 11b is an example of the first lower electrode. The gate electrode 11c is an example of the first gate electrode. The gate resistor 11x is an example of the first gate resistor. The Schottky barrier diode 11y is an example of the first Schottky barrier diode.

The source electrode 11a is electrically connected to the fifth region 33a of the third metal layer 33. The source electrode 11a and the fifth region 33a are electrically connected to each other by using, for example, the bonding wire 44. The drain electrode 11b is electrically connected to the first metal layer 31. The drain electrode 11b is electrically connected to the first metal layer 31 by using, for example, a solder layer or a silver nanoparticle layer (not shown).

The high side MOSFET 12 is provided on the first metal layer 31. The distance from the first region 31a to the high side MOSFET 12 is longer than the distance from the first region 31a to the high side MOSFET 11.

The high side MOSFET 12 includes the source electrode 12a, the drain electrode 12b, the gate electrode 12c, the gate resistor 12x, and the Schottky barrier diode 12y. The source electrode 12a is an example of the second upper electrode. The drain electrode 12b is an example of the second lower electrode. The gate electrode 12c is an example of the second gate electrode. The gate resistor 12x is an example of the second gate resistor. The Schottky barrier diode 12y is an example of a second Schottky barrier diode.

The source electrode 12a is electrically connected to the sixth region 33b of the third metal layer 33. The source electrode 12a and the sixth region 33b are electrically connected to each other by using, for example, the bonding wire 44. The drain electrode 12b is electrically connected to the first metal layer 31. The drain electrode 12b is electrically connected to the first metal layer 31 by using, for example, a solder layer or a silver nanoparticle layer (not shown).

The high side MOSFET 13 is provided on the first metal layer 31. The distance from the first region 31a to the high side MOSFET 13 is longer than the distance from the first region 31a to the high side MOSFET 12.

The high side MOSFET 13 includes the source electrode 13a, the drain electrode 13b, the gate electrode 13c, the gate resistor 13x, and the Schottky barrier diode 13y.

The source electrode 13a is electrically connected to the third metal layer 33. The source electrode 13a and the third metal layer 33 are electrically connected to each other by using, for example, the bonding wire 44. The drain electrode 13b is electrically connected to the first metal layer 31. The drain electrode 13b is electrically connected to the first metal layer 31 by using, for example, a solder layer or a silver nanoparticle layer (not shown).

The low side MOSFET 21 is provided on the third metal layer 33. The low side MOSFET 21 includes the source electrode 21a, the drain electrode 21b, the gate electrode 21c, the gate resistor 21x, and the Schottky barrier diode 21y. The source electrode 21a is an example of the third upper electrode. The drain electrode 21b is an example of the third lower electrode. The gate electrode 21c is an example of the third gate electrode. The gate resistor 21x is an example of the third gate resistor. The Schottky barrier diode 21y is an example of the third Schottky barrier diode.

The source electrode 21a is electrically connected to the third region 32b of the second metal layer 32. The source electrode 21a and the third region 32b are electrically connected to each other by using, for example, the bonding wire 44. The drain electrode 21b is electrically connected to the third metal layer 33. The drain electrode 21b is electrically connected to the third metal layer 33 by using, for example, a solder layer or a silver nanoparticle layer (not shown).

The low side MOSFET 22 is provided on the third metal layer 33. The distance from the fifth region 33a to the low side MOSFET 22 is longer than the distance from the fifth region 33a to the low side MOSFET 21.

The low side MOSFET 22 includes the source electrode 22a, the drain electrode 22b, the gate electrode 22c, the gate resistor 22x, and the Schottky barrier diode 22y. The source electrode 22a is an example of the fourth upper electrode. The drain electrode 22b is an example of the fourth lower electrode. The gate electrode 22c is an example of the fourth gate electrode. The gate resistor 22x is an example of the fourth gate resistor. The Schottky barrier diode 22y is an example of the fourth Schottky barrier diode.

The source electrode 22a is electrically connected to the fourth region 32c of the second metal layer 32. The source electrode 22a and the fourth region 32c are electrically connected to each other by using, for example, the bonding wire 44. The drain electrode 22b is electrically connected to the third metal layer 33. The drain electrode 22b is electrically connected to the third metal layer 33 by using, for example, a solder layer or a silver nanoparticle layer (not shown).

The low side MOSFET 23 is provided on the third metal layer 33. The distance from the fifth region 33a to the low side MOSFET 23 is longer than the distance from the fifth region 33a to the low side MOSFET 22.

The low side MOSFET 23 includes the source electrode 23a, the drain electrode 23b, the gate electrode 23c, the gate resistor 23x, and the Schottky barrier diode 23y.

The source electrode 23a is electrically connected to the second metal layer 32. The source electrode 22a and the second metal layer 32 are electrically connected to each other by using, for example, the bonding wire 44. The drain electrode 23b is electrically connected to the third metal layer 33. The drain electrode 23b is electrically connected to the third metal layer 33 by using, for example, a solder layer or a silver nanoparticle layer (not shown).

The high side MOSFET 11, the high side MOSFET 12, the high side MOSFET 13, the low side MOSFET 21, the low side MOSFET 22, and the low side MOSFET 23 are formed by using, for example, silicon carbide (SiC). The high side MOSFET 11, the high side MOSFET 12, the high side MOSFET 13, the low side MOSFET 21, the low side MOSFET 22, and the low side MOSFET 23 contain silicon carbide. Each of the high side MOSFET 11, the high side MOSFET 12, the high side MOSFET 13, the low side MOSFET 21, the low side MOSFET 22, and the low side MOSFET 23 includes a silicon carbide layer (not shown).

The sealing resin 50 is filled in the resin case 24. The sealing resin 50 is surrounded by the resin case 24. The sealing resin 50 covers the high side MOSFET 11, the high side MOSFET 12, the high side MOSFET 13, the low side MOSFET 21, the low side MOSFET 22, the low side MOSFET 23, and the insulating substrate 30.

The sealing resin 50 has a function of protecting the high side MOSFET 11, the high side MOSFET 12, the high side MOSFET 13, the low side MOSFET 21, the low side MOSFET 22, the low side MOSFET 23, and the insulating substrate 30. In addition, the sealing resin 50 has a function of insulating the high side MOSFET 11, the high side MOSFET 12, the high side MOSFET 13, the low side MOSFET 21, the low side MOSFET 22, the low side MOSFET 23, and the insulating substrate 30.

The sealing resin 50 contains a resin. The sealing resin 50 is, for example, a silicone gel. For example, other resins such as epoxy resin and polyimide resin can be applied as the sealing resin 50.

The positive terminal P is provided on one end side of the insulating substrate 30. For example, in FIG. 1, the positive terminal P is provided on the right side of the insulating substrate 30. The positive terminal P has a wiring connection hole.

The positive terminal P is electrically connected to the first metal layer 31. The positive terminal P is electrically connected to the first region 31a of the first metal layer 31. The positive terminal P is electrically connected to the first region 31a by using, for example, the bonding wire 44.

For example, a positive voltage is applied to the positive terminal P from the outside.

The positive terminal P is formed of metal. The positive terminal P is, for example, copper.

The negative terminal N is provided on the one end side of the insulating substrate 30. The negative terminal N is provided on the same side of the insulating substrate 30 as the positive terminal P. For example, in FIG. 1, the negative terminal N is provided on the right side of the insulating substrate 30. The negative terminal N has a wiring connection hole.

The negative terminal N is electrically connected to the second metal layer 32. The negative terminal N is electrically connected to the second region 32a of the second metal layer 32. The negative terminal N is electrically connected to the second region 32a by using, for example, the bonding wire 44.

For example, a negative voltage is applied to the negative terminal N from the outside.

The negative terminal N is formed of metal. The negative terminal N is, for example, copper.

The AC output terminal AC is provided on the other end side of the insulating substrate 30. The AC output terminal AC is provided on a side opposite to the positive terminal P and the negative terminal N with the insulating substrate 30 interposed therebetween. In FIG. 1, the AC output terminal AC is provided on the left side of the insulating substrate 30. The AC output terminal AC has a wiring connection hole. FIG. 1 illustrates a case where there are two AC output terminals AC.

The AC output terminal AC is electrically connected to the third metal layer 33. The AC output terminal AC is electrically connected to the seventh region 33c of the third metal layer 33. The AC output terminal AC is electrically connected to the seventh region 33c by using, for example, the bonding wire 44.

The AC output terminal AC outputs the output current of the half-bridge circuit.

The first gate terminal 41 is electrically connected to the gate electrode 11c of the high side MOSFET 11. The first gate terminal 41 is electrically connected to the gate electrode 11c by using, for example, the first gate metal layer 36 and the bonding wire 44. No gate resistance component is provided between the first gate terminal 41 and the gate electrode 11c. The electrical resistance between the first gate terminal 41 and the gate electrode 11c is, for example, equal to or less than 5Ω.

The first gate terminal 41 is electrically connected to the gate electrode 12c of the high side MOSFET 12. The first gate terminal 41 is electrically connected to the gate electrode 12c by using, for example, the first gate metal layer 36 and the bonding wire 44. No gate resistance component is provided between the first gate terminal 41 and the gate electrode 12c. The electrical resistance between the first gate terminal 41 and the gate electrode 12c is, for example, equal to or less than 5Ω.

The first gate terminal 41 is electrically connected to the gate electrode 13c of the high side MOSFET 13. The first gate terminal 41 is electrically connected to the gate electrode 13c by using, for example, the first gate metal layer 36 and the bonding wire 44. No gate resistance component is provided between the first gate terminal 41 and the gate electrode 13c. The electrical resistance between the first gate terminal 41 and the gate electrode 13c is, for example, equal to or less than 5Ω.

The second gate terminal 42 is electrically connected to the gate electrode 21c of the low side MOSFET 21. The second gate terminal 42 is electrically connected to the gate electrode 21c by using, for example, the second gate metal layer 37 and the bonding wire 44. No gate resistance component is provided between the second gate terminal 42 and the gate electrode 21c. The electrical resistance between the second gate terminal 42 and the gate electrode 21c is, for example, equal to or less than 5Ω.

The second gate terminal 42 is electrically connected to the gate electrode 22c of the low side MOSFET 22. The second gate terminal 42 is electrically connected to the gate electrode 22c by using, for example, the second gate metal layer 37 and the bonding wire 44. No gate resistance component is provided between the second gate terminal 42 and the gate electrode 22c. The electrical resistance between the second gate terminal 42 and the gate electrode 22c is, for example, equal to or less than 5Ω.

The second gate terminal 42 is electrically connected to the gate electrode 23c of the low side MOSFET 23. The second gate terminal 42 is electrically connected to the gate electrode 23c by using, for example, the second gate metal layer 37 and the bonding wire 44. No gate resistance component is provided between the second gate terminal 42 and the gate electrode 23c. The electrical resistance between the second gate terminal 42 and the gate electrode 23c is, for example, equal to or less than 5Ω.

The first metal layer 31 is provided on the insulating substrate 30. The first metal layer 31 includes the first region 31a. The first metal layer 31 is electrically connected to the positive terminal P in the first region 31a.

The second metal layer 32 is provided on the insulating substrate 30. The second metal layer 32 includes the second region 32a, the third region 32b, and the fourth region 32c. The second metal layer 32 is electrically connected to the negative terminal N in the second region 32a. The second metal layer 32 is electrically connected to the source electrode 21a of the low side MOSFET 21 in the third region 32b. The second metal layer 32 is electrically connected to the source electrode 22a of the low side MOSFET 22 in the fourth region 32c.

The second metal layer 32 includes the first end portion E1 and the second end portion E2. The first end portion E1 is an end on the side facing the third metal layer 33. The second end portion E2 is an end portion on a side opposite to the first end portion E1 with the second metal layer 32 interposed therebetween.

The second metal layer 32 includes the slit 32x. The slit 32x is disposed between the third region 32b and the second end portion E2. The slit 32x extends, for example, in a first direction from the low side MOSFET 21 to the low side MOSFET 22.

For example, the first distance (d1 in FIG. 1) between the first end portion E1 and the slit 32x is smaller than the second distance (d2 in FIG. 1) between the slit 32x and the second end portion E2. For example, the first distance d1 is equal to or less than 80% of the second distance d2.

The slit 32x has a function of increasing the parasitic inductance of the wiring of the low side MOSFET 21.

The length (L1 in FIG. 1) of the slit 32x in the first direction is larger than, for example, the length (L2 in FIG. 1) of the low side MOSFET 21 in the first direction. For example, the length L1 of the slit 32x is equal to or more than 120% and equal to or less than 400% of the length L2 of the low side MOSFET 21.

The third metal layer 33 is provided on the insulating substrate 30. The third metal layer 33 includes the fifth region 33a, the sixth region 33b, and the seventh region 33c. The third metal layer 33 is electrically connected to the source electrode 11a of the high side MOSFET 11 in the fifth region 33a. The third metal layer 33 is electrically connected to the source electrode 12a of the high side MOSFET 12 in the sixth region 33b. The third metal layer 33 is electrically connected to the AC output terminal AC in the seventh region 33c.

The resistance-reducing bonding wire 60 (conductive member) is provided between the slit 32x and the second end portion E2. The resistance-reducing bonding wire 60 extends in the first direction. For example, eight resistance-reducing bonding wires 60 are provided on the second metal layer 32.

Figure 5B:
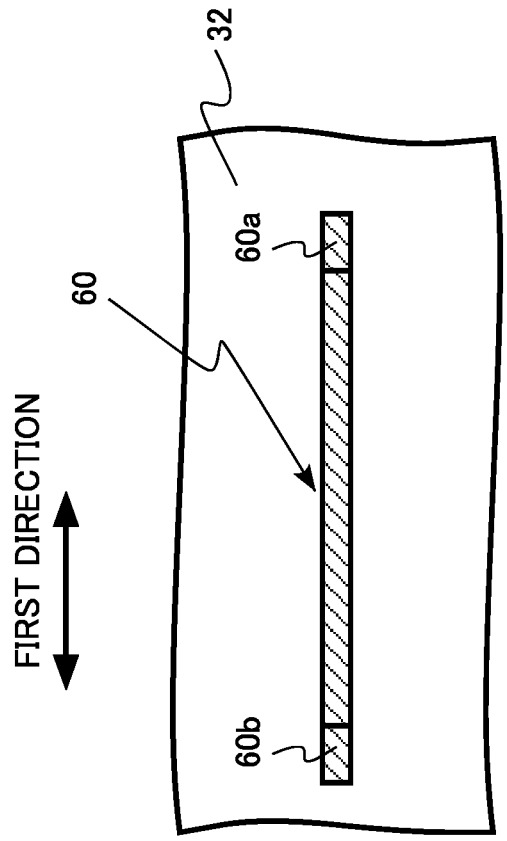
FIGS. 5A and 5B are schematic diagrams of a conductive member of the semiconductor device of the first embodiment.
Figure 5A:
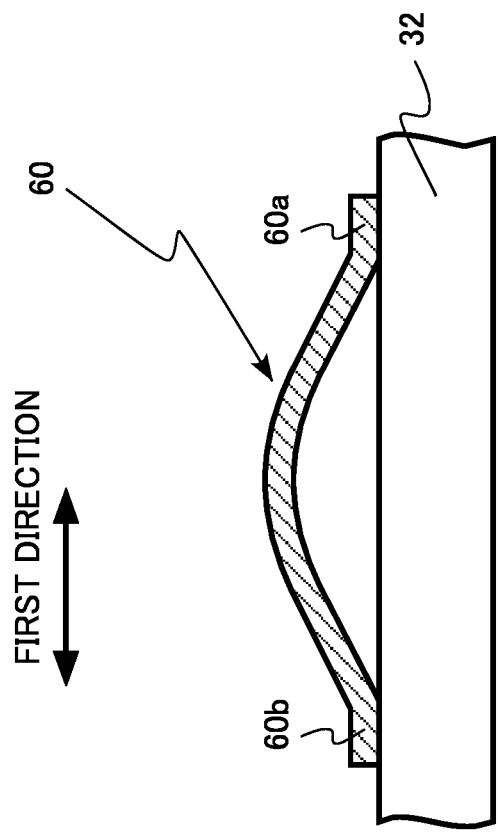

FIGS. 5A and 5B are schematic diagrams of a conductive member of the semiconductor device of the first embodiment. FIG. 5A is a top view, and FIG. 5B is a cross-sectional view. FIGS. 5A and 5B show one of a plurality of resistance-reducing bonding wires 60.

The resistance-reducing bonding wire 60 has a first portion 60a and a second portion 60b. The first portion 60a is disposed on the side of the negative terminal N, and the second portion 60b is disposed on the side of the AC output terminal AC. The first portion 60a and the second portion 60b are electrically connected to the second metal layer 32.

The resistance-reducing bonding wire 60 has a function of reducing the electrical resistance of the second metal layer 32.

The resistance-reducing bonding wire 60 is, for example, a metal. The resistance-reducing bonding wire 60 contains, for example, copper or aluminum. The resistance-reducing bonding wire 60 is formed of the same material as the second metal layer 32, for example.

Next, the function and effect of the power semiconductor module 100 of the first embodiment will be described.

In the power semiconductor module, in order to reduce the power consumption, it is desired to reduce the switching loss by shortening the switching time. When the power semiconductor chip includes a MOSFET that operates in a unipolar manner, for example, the switching time can be shortened as compared with a case where the power semiconductor chip includes an insulated gate bipolar transistor (IGBT) that operates in a bipolar manner.

Figure 6:
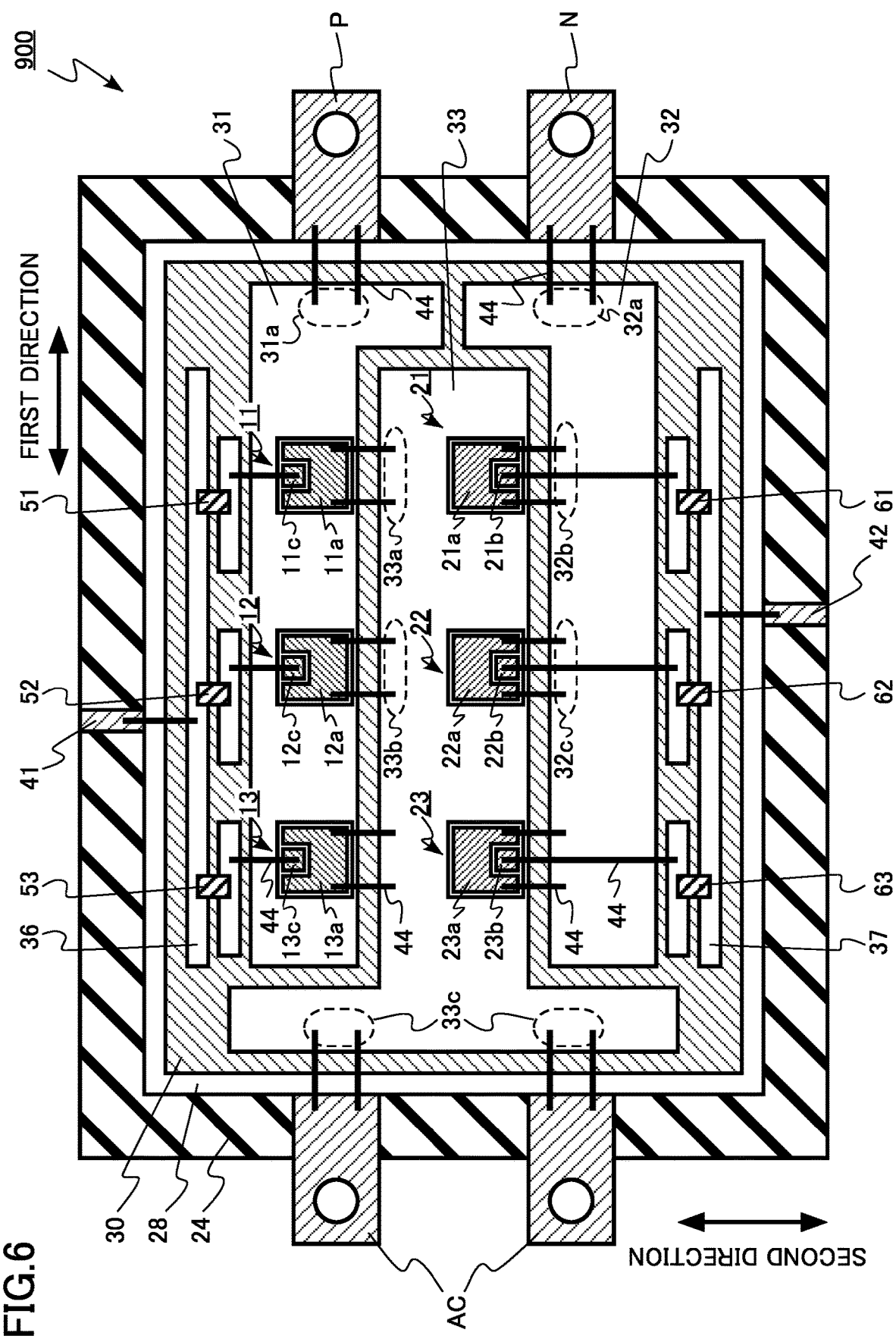
FIG. 6 is a schematic top view of a semiconductor device of a comparative example.

FIG. 6 is a schematic top view of a semiconductor device of a comparative example. FIG. 6 is a diagram corresponding to FIG. 1.

The semiconductor device of the comparative example is a power semiconductor module 900. The power semiconductor module 900 of the comparative example is different from the power semiconductor module 100 of the first embodiment in that the second metal layer 32 does not include the slit 32x. In addition, the power semiconductor module 900 of the comparative example is different from the power semiconductor module 100 of the first embodiment in that the resistance-reducing bonding wire 60 is not provided on the second metal layer 32.

In addition, the power semiconductor module 900 of the comparative example is different from the power semiconductor module 100 of the first embodiment in that a gate resistance component is provided on the insulating substrate 30. That is, the power semiconductor module 900 includes a first gate resistor 51, a second gate resistor 52, a third gate resistor 53, a fourth gate resistor 61, a fifth gate resistor 62, and a sixth gate resistor 63. The resistance of each of the first gate resistor 51, the second gate resistor 52, the third gate resistor 53, the fourth gate resistor 61, the fifth gate resistor 62, and the sixth gate resistor 63 is, for example, equal to or more than 5Ω.

The first gate resistor 51 is electrically connected between the first gate terminal 41 and the high side MOSFET 11. The second gate resistor 52 is electrically connected between the first gate terminal 41 and the high side MOSFET 12. The third gate resistor 53 is electrically connected between the first gate terminal 41 and the high side MOSFET 13.

The fourth gate resistor 61 is electrically connected between the second gate terminal 42 and the low side MOSFET 21. The fifth gate resistor 62 is electrically connected between the second gate terminal 42 and the low side MOSFET 22. The sixth gate resistor 63 is electrically connected between the second gate terminal 42 and the low side MOSFET 23.

Each of the first gate resistor 51, the second gate resistor 52, the third gate resistor 53, the fourth gate resistor 61, the fifth gate resistor 62, and the sixth gate resistor 63 has a function of suppressing the ringing of the output of the power semiconductor module 900 by suppressing the inrush current applied to the gate electrode of each MOSFET.

In the power semiconductor module 900, the high side MOSFET 11, the high side MOSFET 12, and the high side MOSFET 13 are connected in parallel to each other, as in the power semiconductor module 100. In addition, in the power semiconductor module 900, the low side MOSFET 21, the low side MOSFET 22, and the low side MOSFET 23 are connected in parallel to each other, as in the power semiconductor module 100.

For example, in the power semiconductor module 900, the wiring length from the negative terminal N to the MOSFET increases in the order of the low side MOSFET 21, the low side MOSFET 22, and the low side MOSFET 23. Therefore, the parasitic inductance of the wiring of the MOSFET increases in the order of the low side MOSFET 21, the low side MOSFET 22, and the low side MOSFET 23.

If the parasitic inductances of MOSFETs arranged in parallel are different, a surge voltage generated in a voltage (hereinafter, referred to as a gate voltage) between the gate electrode and the source electrode of each MOSFET varies when the power semiconductor module 900 is switched. In addition, if the parasitic inductances of MOSFETs arranged in parallel are different, a surge current flowing through, for example, a built-in SBD of each MOSFET varies when the power semiconductor module 900 is switched.

For example, when the high side MOSFET is turned on, a surge voltage generated in the gate voltage of the off-state low side MOSFET varies. For example, if a positive surge voltage is applied to the gate electrode, a problem may occur in which an erroneous ignition occurs in the power semiconductor module 900 and a through current flows. When the through current flows, for example, the power semiconductor module 900 may be damaged by heat generation.

In addition, for example, if a negative surge voltage is applied to the gate electrode, a problem may occur in which the gate insulating film of the MOSFET is damaged. If the gate insulating film of the MOSFET is damaged, the power semiconductor module 900 is damaged.

For example, in the power semiconductor module 900, a positive surge voltage is likely to be applied to the low side MOSFET 21 near the negative terminal N. In addition, for example, a negative surge voltage is likely to be applied to the low side MOSFET 23 far from the negative terminal N.

In addition, for example, when the high side MOSFET is turned off, the magnitude of the surge current flowing through the SBD of the off-state low side MOSFET varies. If the surge current flowing through the SBD increases, the current flowing through the pn junction diode of the MOSFET may increase. When the MOSFET is formed of silicon carbide, if a current flows through the pn junction diode that operates in a bipolar manner, the on-resistance of the MOSFET may increase with the growth of the stacked defect. As the on-resistance of the MOSFET increases, the reliability of the power semiconductor module 900 may decrease.

For example, in the power semiconductor module 900, the surge current flowing through the built-in SBD of the low side MOSFET 21 near the negative terminal N is likely to be larger than the surge current flowing through the SBD of the low side MOSFET 22 or the surge current flowing through the SBD of the low side MOSFET 23.

As described above, in the power semiconductor module 900, due to the variation in the parasitic inductance of the wirings of the MOSFETs arranged in parallel, damage to the power semiconductor module 900 at the time of switching or the deterioration of reliability is likely to occur. For example, by reducing the switching speed of the power semiconductor module 900, the surge voltage or surge current is reduced. Therefore, it is possible to solve the problem described above. However, reducing the switching speed increases the switching loss of the power semiconductor module 900.

In the power semiconductor module 100 of the first embodiment, the second metal layer 32 includes the slit 32x. By providing the slit 32x, the effective wiring length between the low side MOSFET 21 closest to the negative terminal N and the negative terminal N becomes longer than that in the power semiconductor module 900 of the comparative example. For this reason, the parasitic inductance of the wiring between the low side MOSFET 21 and the negative terminal N becomes larger than that in the power semiconductor module 900 of the comparative example. Therefore, since the variation in the parasitic inductance of the wirings of the MOSFETs arranged in parallel is reduced, damage to the power semiconductor module 100 at the time of switching or the deterioration of reliability is suppressed. As a result, the switching loss of the power semiconductor module 100 is reduced.

From the viewpoint of reducing the variation in the parasitic inductance of the MOSFETs arranged in parallel, it is preferable that the first distance (d1 in FIG. 1) between the first end portion E1 and the slit 32x is smaller than the second distance (d2 in FIG. 1) between the slit 32x and the second end portion E2. The first distance d1 is preferably equal to or less than 80% of the second distance d2, more preferably equal to or less than 60% of the second distance d2.

From the viewpoint of reducing the variation in the parasitic inductance of the MOSFETs arranged in parallel, it is preferable that the length (L1 in FIG. 1) of the slit 32x in the first direction is larger than the length (L2 in FIG. 1) of the low side MOSFET 21 in the first direction. The length L1 of the slit 32x is preferably equal to or more than 120% of the length L2 of the low side MOSFET 21, more preferably equal to or more than 150% of the length L2 of the low side MOSFET 21.

In addition, the power semiconductor module 100 of the first embodiment does not include a gate resistance component. Since there is no gate resistance component, a space for providing the gate resistance component on the insulating substrate 30 is not necessary. For this reason, for example, the width of the first metal layer 31, the second metal layer 32, or the third metal layer 33 in the second direction can be made larger than that in the power semiconductor module 900 of the comparative example. Therefore, it is possible to reduce the switching loss of the power semiconductor module 100 by reducing the parasitic inductance of the power semiconductor module 100.

In the power semiconductor module 100 of the first embodiment, each MOSFET has a gate resistor built in the chip. Therefore, since the inrush current applied to each MOSFET is suppressed, the ringing of the output of the power semiconductor module 100 is suppressed.

The power semiconductor module 100 does not include a gate resistance component. Therefore, the electrical resistance between the first gate terminal 41 and the gate electrode of each high side MOSFET is, for example, equal to or less than 5Ω. In addition, the electrical resistance between the second gate terminal 42 and the gate electrode of each low side MOSFET is, for example, equal to or less than 5Ω.

In addition, in the power semiconductor module 100 of the first embodiment, the resistance-reducing bonding wire 60 is provided on the second metal layer 32. The resistance-reducing bonding wire 60 is provided between the slit 32x and the second end portion E2.

In the power semiconductor module 100 of the first embodiment, when there is no resistance-reducing bonding wire 60, the electrical resistance of the second metal layer 32 becomes higher than that in the power semiconductor module 900 of the comparative example by providing the slit 32x in the second metal layer 32. For this reason, for example, the electrical resistance of the current path from the AC output terminal AC to the negative terminal N may increase, and the steady loss of the power semiconductor module 100 may increase.

The power semiconductor module 100 of the first embodiment includes the resistance-reducing bonding wire 60. For this reason, the electrical resistance of the second metal layer 32 in a portion between the slit 32x and the second end portion E2 is reduced. Therefore, it is possible to reduce the steady loss.

As described above, according to the first embodiment, the switching loss of the power semiconductor module can be reduced by reducing the variation in the parasitic inductance of the power semiconductor chips arranged in parallel. In addition, the steady loss of the power semiconductor module can be reduced by reducing the electrical resistance of the current path.

Second Embodiment

A semiconductor device of a second embodiment is different from the semiconductor device of the first embodiment in that the conductive member is a bridge-shaped member. Hereinafter, the description of a part of the content overlapping the semiconductor device of the first embodiment may be omitted.

Figure 7:
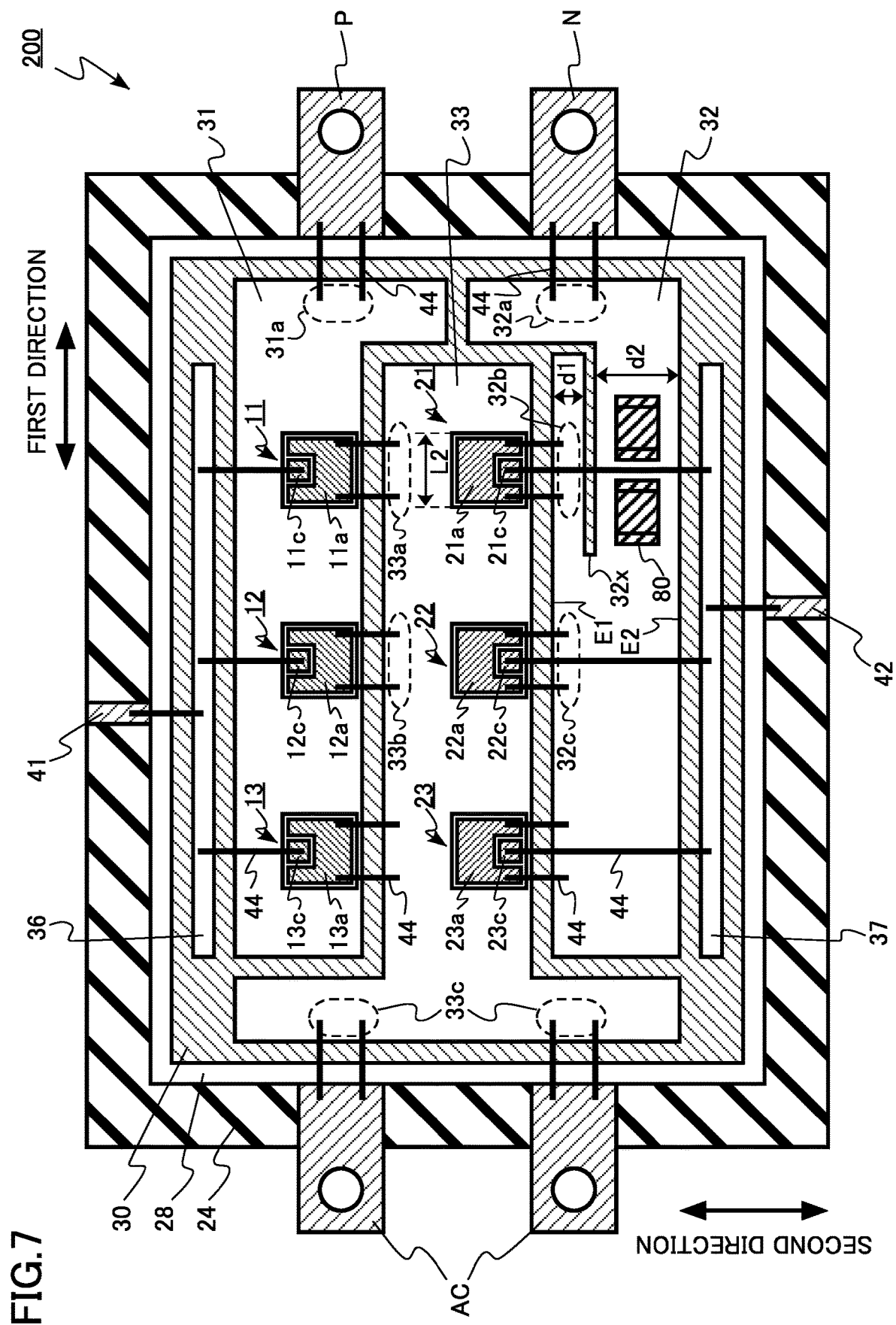
FIG. 7 is a schematic top view of a semiconductor device of a second embodiment.

FIG. 7 is a schematic top view of the semiconductor device of the second embodiment. FIG. 7 is a diagram corresponding to FIG. 1 of the first embodiment.

The semiconductor device of the second embodiment is a power semiconductor module 200. The power semiconductor module 200 of the second embodiment is a so-called "2in1" type module in which a half-bridge circuit can be configured by one module. In the power semiconductor module 200, three half-bridge units are connected in parallel to each other.

The power semiconductor module 200 includes a bridge-shaped member 80 (conductive member).

The bridge-shaped member 80 is provided between the slit 32x and the second end portion E2. The bridge-shaped member 80 extends in the first direction. For example, two bridge-shaped members 80 are provided side by side in the first direction on the second metal layer 32.

FIGS. 8A and 8B are schematic diagrams of a conductive member of the semiconductor device of the second embodiment. FIG. 8A is a top view, and FIG. 8B is a cross-sectional view. FIGS. 8A and 8B show one of the plurality of bridge-shaped members 80.

The bridge-shaped member 80 has a first portion 80*a* and a second portion 80*b*. The first portion 80*a* is disposed on the side of the negative terminal N, and the second portion 80*b* is disposed on the side of the AC output terminal AC.

The first portion 80*a* and the second portion 80*b* are electrically connected to the second metal layer 32. The first portion 80*a* and the second portion 80*b* are connected to the second metal layer 32 by, for example, a solder layer (not shown). The first portion 80*a* and the second portion 80*b* are connected to the second metal layer 32 by, for example, ultrasonic connection.

The bridge-shaped member 80 has a function of reducing the electrical resistance of the second metal layer 32.

The bridge-shaped member 80 is, for example, a metal. The bridge-shaped member 80 contains, for example, copper or aluminum. The bridge-shaped member 80 is formed of the same material as the second metal layer 32, for example.

As described above, according to the second embodiment, the switching loss of the power semiconductor module can be reduced by reducing the variation in the parasitic inductance of the power semiconductor chips arranged in parallel as in the first embodiment. In addition, as in the first embodiment, the steady loss of the power semiconductor module can be reduced by reducing the electrical resistance of the current path.

Third Embodiment

A semiconductor device of a third embodiment is different from the semiconductor device of the first embodiment in that the conductive member is a plate-shaped member. Hereinafter, the description of a part of the content overlapping the semiconductor device of the first embodiment may be omitted.

Figure 9:
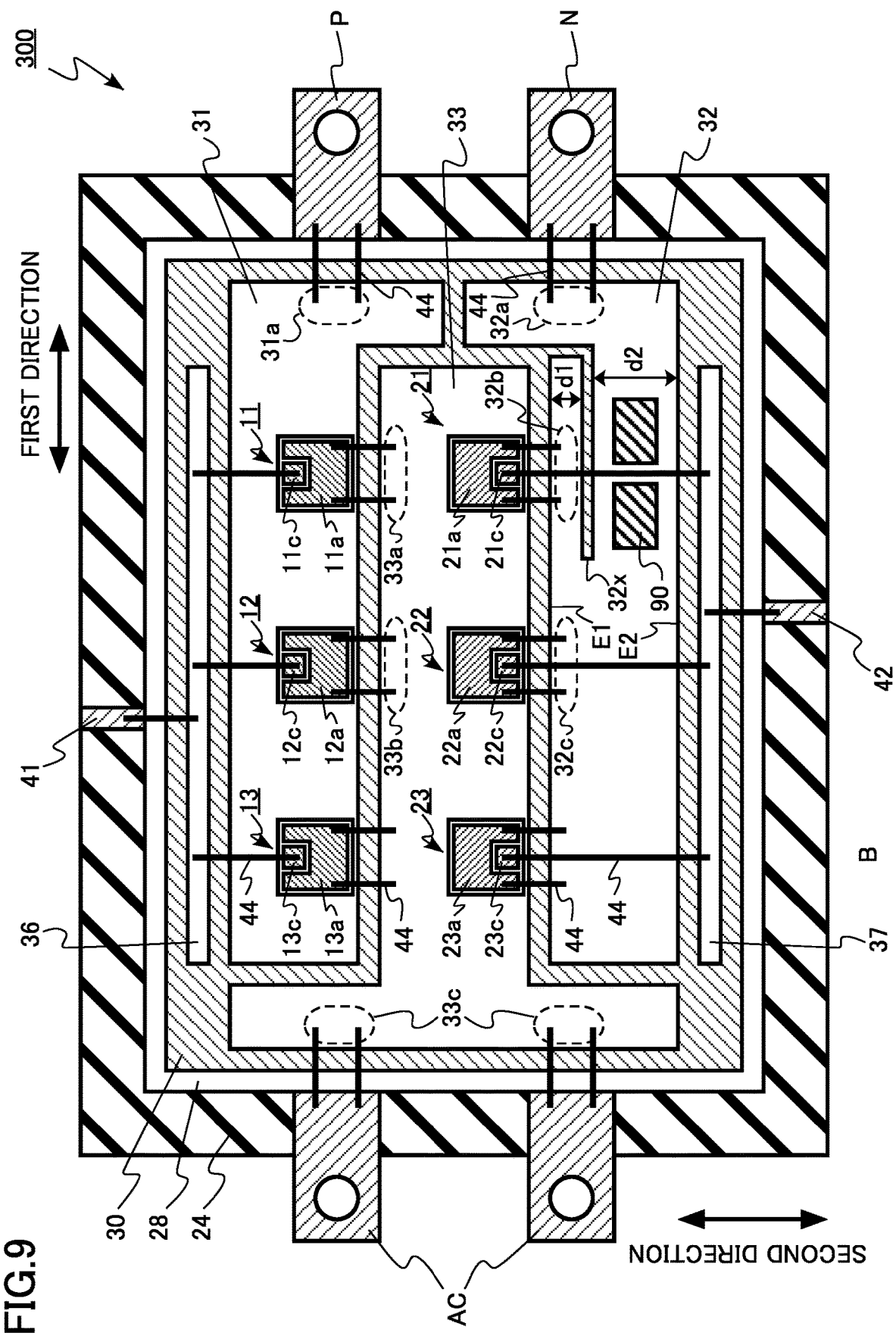
FIG. 9 is a schematic top view of a semiconductor device of a third embodiment.

FIG. 9 is a schematic top view of the semiconductor device of the third embodiment. FIG. 9 is a diagram corresponding to FIG. 1 of the first embodiment.

The semiconductor device of the third embodiment is a power semiconductor module 300. The power semiconductor module 300 of the third embodiment is a so-called "2in1" type module in which a half-bridge circuit can be configured by one module. In the power semiconductor module 300, three half-bridge units are connected in parallel to each other.

The power semiconductor module 300 includes a plate-shaped member 90 (conductive member).

The plate-shaped member 90 is provided between the slit 32x and the second end portion E2. The plate-shaped member 90 extends in the first direction. For example, two plate-shaped members 90 are provided side by side in the first direction on the second metal layer 32.

Figure 10B:
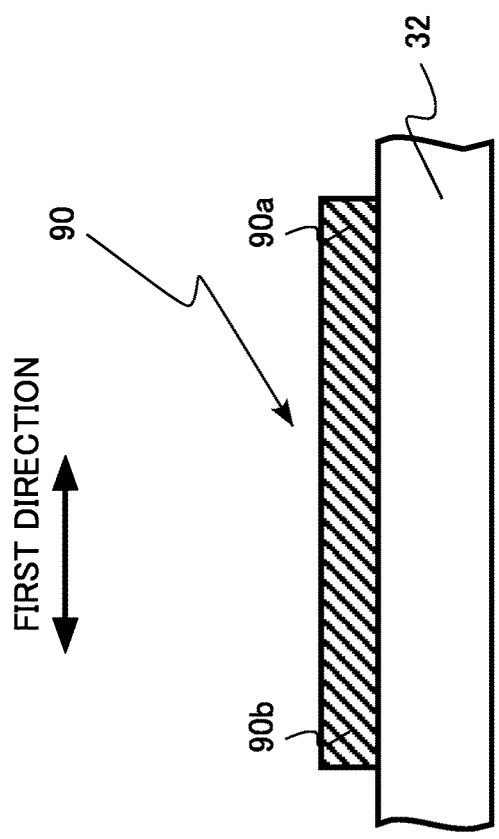
FIGS. 10A and 10B are schematic diagrams of a conductive member of the semiconductor device of the third embodiment.
Figure 10A:
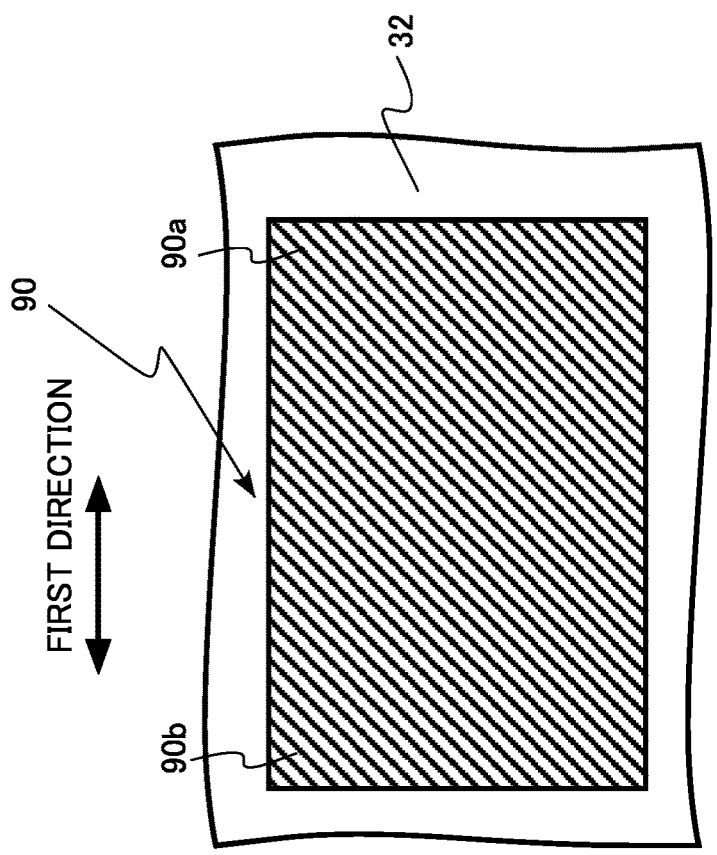

FIGS. 10A and 10B are schematic diagrams of a conductive member of the semiconductor device of the third embodiment. FIG. 10A is a top view, and FIG. 10B is a cross-sectional view. FIGS. 10A and 10B show one of the plurality of plate-shaped members 90.

The plate-shaped member 90 has a first portion 90a and a second portion 90b. The first portion 90a is disposed on the side of the negative terminal N, and the second portion 90b is disposed on the side of the AC output terminal AC.

The entire lower surface of the plate-shaped member 90 including the first portion 90a and the second portion 90b is electrically connected to the second metal layer 32. The plate-shaped member 90 is connected to the second metal layer 32 by, for example, a solder layer (not shown). The plate-shaped member 90 is connected to the second metal layer 32 by, for example, ultrasonic connection.

The plate-shaped member 90 has a function of reducing the electrical resistance of the second metal layer 32.

The plate-shaped member 90 is, for example, a metal. The plate-shaped member 90 contains, for example, copper or aluminum. The plate-shaped member 90 is formed of the same material as the second metal layer 32, for example.

As described above, according to the third embodiment, the switching loss of the power semiconductor module can be reduced by reducing the variation in the parasitic inductance of the power semiconductor chips arranged in parallel as in the first embodiment. In addition, as in the first embodiment, the steady loss of the power semiconductor module can be reduced by reducing the electrical resistance of the current path.

Fourth Embodiment

A semiconductor device of a fourth embodiment is different from the semiconductor device of the first embodiment in that a conductive member is also provided between the slit and the first end portion. Hereinafter, the description of a part of the content overlapping the semiconductor device of the first embodiment may be omitted.

Figure 11:
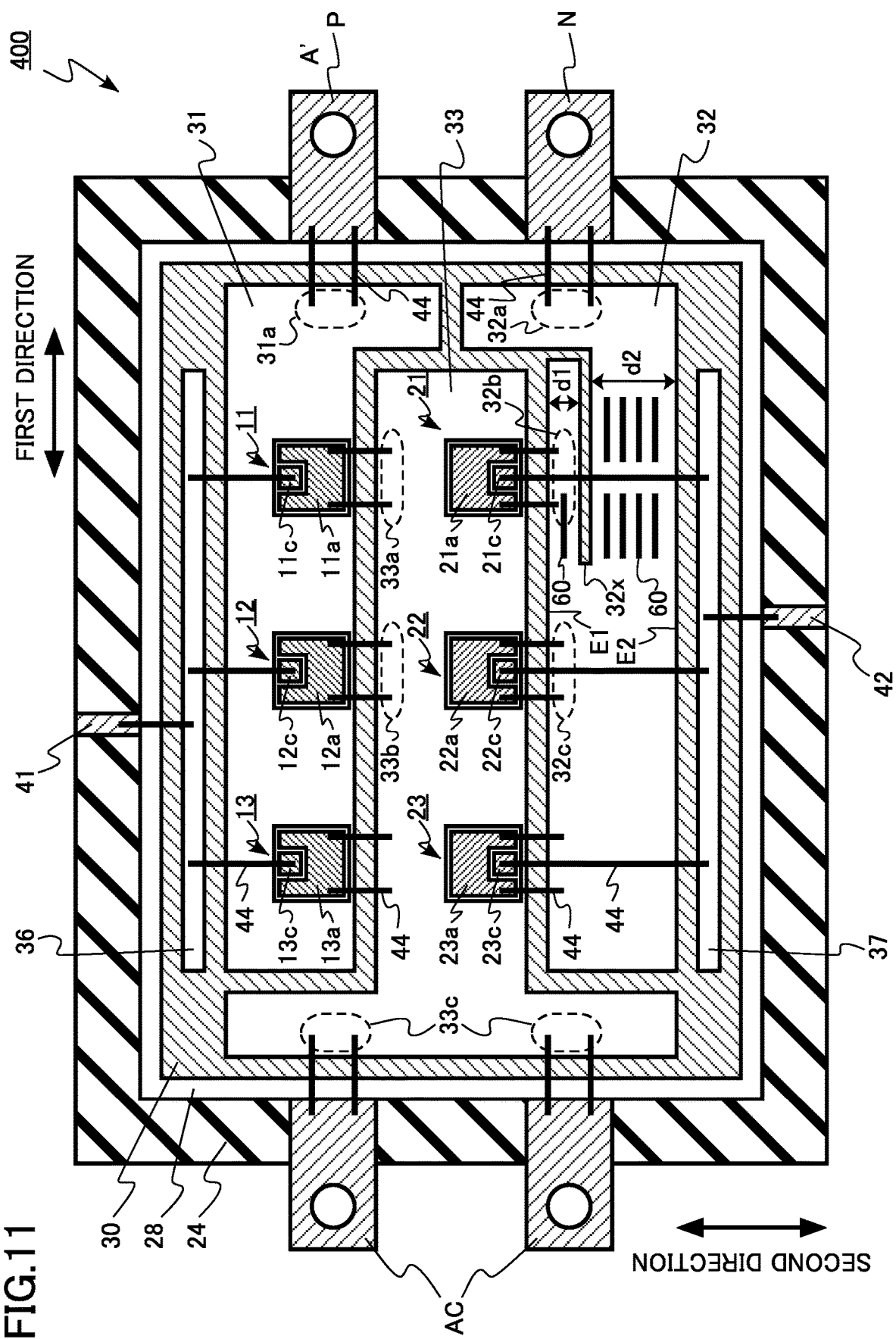
FIG. 11 is a schematic top view of a semiconductor device of a fourth embodiment.

FIG. 11 is a schematic top view of the semiconductor device of the fourth embodiment. FIG. 11 is a diagram corresponding to FIG. 1 of the first embodiment.

The semiconductor device of the fourth embodiment is a power semiconductor module 400. The power semiconductor module 400 of the fourth embodiment is a so-called "2in1" type module in which a half-bridge circuit can be configured by one module. In the power semiconductor module 400, three half-bridge units are connected in parallel to each other.

The power semiconductor module 400 includes the resistance-reducing bonding wire 60 (conductive member).

The resistance-reducing bonding wire 60 is provided between the slit 32x and the second end portion E2. The resistance-reducing bonding wire 60 extends in the first direction. For example, eight resistance-reducing bonding wires 60 are provided on the second metal layer 32 between the slit 32x and the second end portion E2.

The resistance-reducing bonding wire 60 is also provided between the slit 32x and the first end portion E1. The resistance-reducing bonding wire 60 extends in the first direction. For example, one resistance-reducing bonding wire 60 is provided on the second metal layer 32 between the slit 32x and the first end portion E1.

The power semiconductor module 400 of the fourth embodiment includes the resistance-reducing bonding wire 60. For this reason, the electrical resistance of the second metal layer 32 in a portion between the slit 32x and the second end portion E2 and a portion between the slit 32x and the first end portion E1 is reduced. Therefore, it is possible to further reduce the steady loss as compared with the first embodiment.

In addition, it is also possible to provide the resistance-reducing bonding wire 60 only in the portion between the slit 32x and the first end portion E1.

As described above, according to the fourth embodiment, the switching loss of the power semiconductor module can be reduced by reducing the variation in the parasitic inductance of the power semiconductor chips arranged in parallel as in the first embodiment. In addition, the steady loss of the power semiconductor module can be reduced by reducing the electrical resistance of the current path.

Fifth Embodiment

A semiconductor device of a fifth embodiment includes: an insulating substrate having one end and the other end on a side opposite to the one end; a first main terminal provided on a side of the one end; a second main terminal provided on the side of the one end; an output terminal provided on a side of the other end; a first metal layer provided on the insulating substrate, having a first region, and electrically connected to the first main terminal in the first region; a second metal layer provided on the insulating substrate, having a second region, a third region, and a fourth region, and electrically connected to the second main terminal in the second region; a third metal layer provided on the insulating substrate, disposed between the first metal layer and the second metal layer, having a fifth region, a sixth region, and a seventh region, and electrically connected to the output terminal in the seventh region; a first semiconductor chip including a first upper electrode, a first lower electrode, and a first gate electrode and provided on the first metal layer, the first upper electrode being electrically connected to the fifth region and the first lower electrode being electrically connected to the first metal layer; a second semiconductor chip including a second upper electrode, a second lower electrode, and a second gate electrode and provided on the first metal layer, the second upper electrode being electrically connected to the sixth region, the second lower electrode being electrically connected to the first metal layer, and a distance of the second semiconductor chip from the first region being longer than a distance of the first semiconductor chip from the first region; a third semiconductor chip including a third upper electrode, a third lower electrode, and a third gate electrode and provided on the third metal layer, the third upper electrode being electrically connected to the third region and the third lower electrode being electrically connected to the third metal layer; a fourth semiconductor chip including a fourth upper electrode, a fourth lower electrode, and a fourth gate electrode and provided on the third metal layer, the fourth upper electrode being electrically connected to the fourth region, the fourth lower electrode being electrically connected to the third metal layer, and a distance of the fourth semiconductor chip from the fifth region being longer than a distance of the third semiconductor chip from the fifth region; and a conductive member, at least a first portion on a side of the second main terminal and a second portion on a side of the output terminal being electrically connected to the third metal layer. The third metal layer has a first end portion on a side facing the first metal layer and a second end portion on a side opposite to the first end portion and includes a slit disposed between the fifth region and the second end portion. The conductive member is provided at a position at least between the slit and the first end portion or between the slit and the second end portion.

The semiconductor device of the fifth embodiment is different from the semiconductor device of the first embodiment in that a slit is provided in the third metal layer instead of the second metal layer. Hereinafter, the description of a part of the content overlapping the first embodiment may be omitted.

Figure 12:
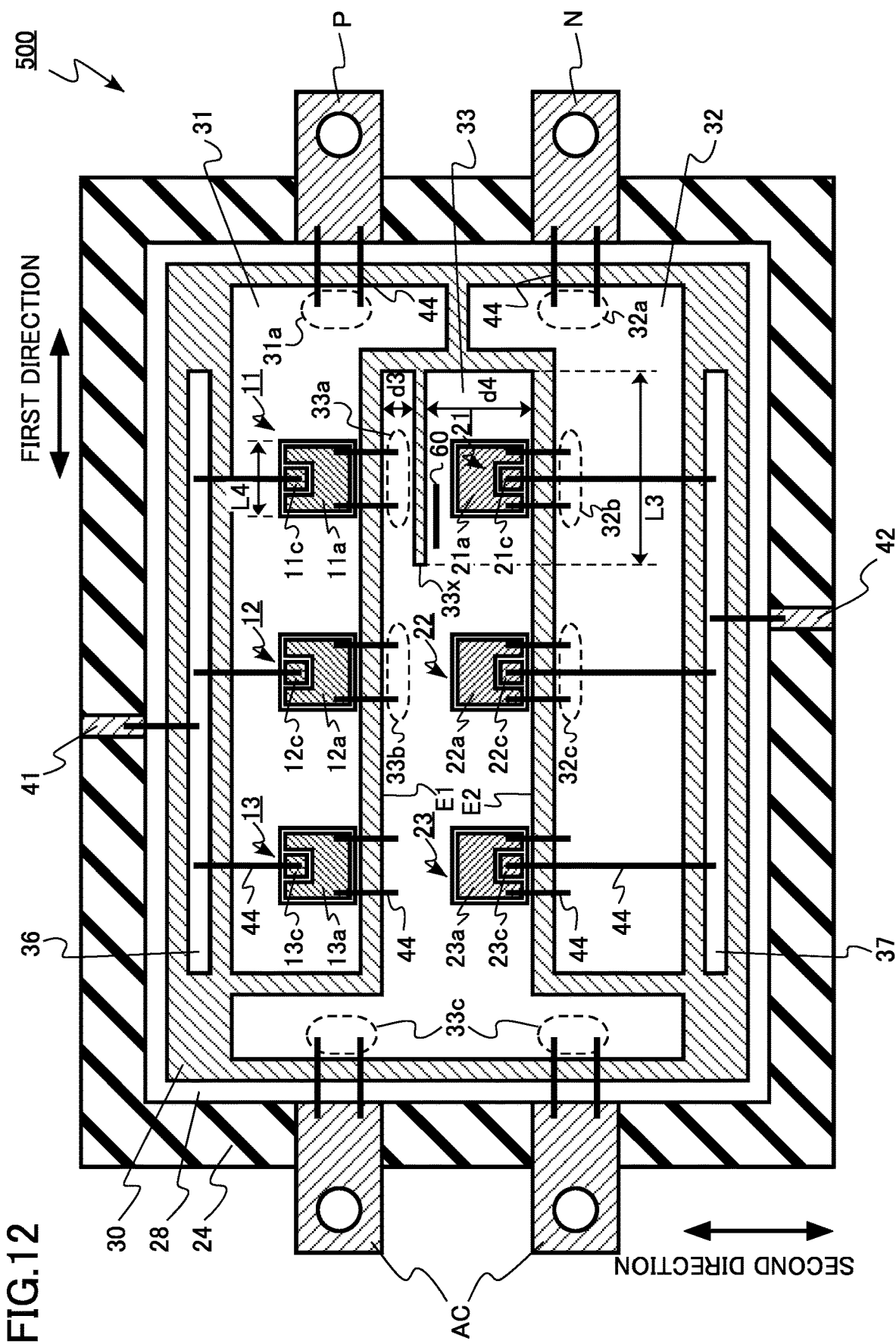
FIG. 12 is a schematic top view of a semiconductor device of a fifth embodiment.

FIG. 12 is a schematic top view of the semiconductor device of the fifth embodiment. FIG. 12 is a diagram corresponding to FIG. 1 of the first embodiment.

The semiconductor device of the fifth embodiment is a power semiconductor module 500. The power semiconductor module 500 of the fifth embodiment is a so-called "2in1" type module in which a half-bridge circuit can be configured by one module. In the power semiconductor module 500, three half-bridge units are connected in parallel to each other.

The power semiconductor module 500 of the fifth embodiment includes a positive terminal P (first main terminal), a negative terminal N (second main terminal), an AC output terminal AC (output terminal), a high side MOSFET 11 (first semiconductor chip), a high side MOSFET 12 (second semiconductor chip), a high side MOSFET 13, a low side MOSFET 21 (third semiconductor chip), a low side MOSFET 22 (fourth semiconductor chip), a low side MOSFET 23, a resin case 24, a lid 26, a metal base 28, an insulating substrate 30, a first metal layer 31, a second metal layer 32, a third metal layer 33, a first gate metal layer 36, a second gate metal layer 37, a back surface metal layer 40, a first gate terminal 41, a second gate terminal 42, a bonding wire 44, a sealing resin 50, and a resistance-reducing bonding wire 60 (conductive member).

The third metal layer 33 is provided on the insulating substrate 30. The third metal layer 33 includes the fifth region 33a, the sixth region 33b, and the seventh region 33c. The third metal layer 33 is electrically connected to the source electrode 11a of the high side MOSFET 11 in the fifth region 33a. The third metal layer 33 is electrically connected to the source electrode 12a of the high side MOSFET 12 in the sixth region 33b. The third metal layer 33 is electrically connected to the AC output terminal AC in the seventh region 33c.

The third metal layer 33 includes a first end portion E1 and a second end portion E2. The first end portion E1 is an end portion on the side facing the first metal layer 31. The second end portion E2 is an end portion on a side opposite to the first end portion E1 with the third metal layer 33 interposed therebetween. The second end portion E2 is an end on the side facing the second metal layer 32.

The third metal layer 33 includes a slit 33x. The slit 33x is disposed between the fifth region 33a and the second end portion E2. The slit 33x extends, for example, in a first direction from the low side MOSFET 21 to the low side MOSFET 22.

For example, the third distance (d3 in FIG. 12) between the first end portion E1 and the slit 33x is smaller than the fourth distance (d4 in FIG. 12) between the slit 33x and the second end portion E2. For example, the third distance d3 is equal to or less than 80% of the fourth distance d4.

The slit 33x has a function of increasing the parasitic inductance of the wiring of the high side MOSFET 11.

The length (L3 in FIG. 12) of the slit 33x in the first direction is larger than, for example, the length (L4 in FIG. 12) of the high side MOSFET 11 in the first direction. For example, the length L3 of the slit 33x is equal to or more than 120% and equal to or less than 400% of the length L4 of the high side MOSFET 11.

The resistance-reducing bonding wire 60 (conductive member) is provided between the slit 33x and the second end portion E2. The resistance-reducing bonding wire 60 extends in the first direction. For example, one resistance-reducing bonding wire 60 is provided on the third metal layer 33.

Figure 13B:
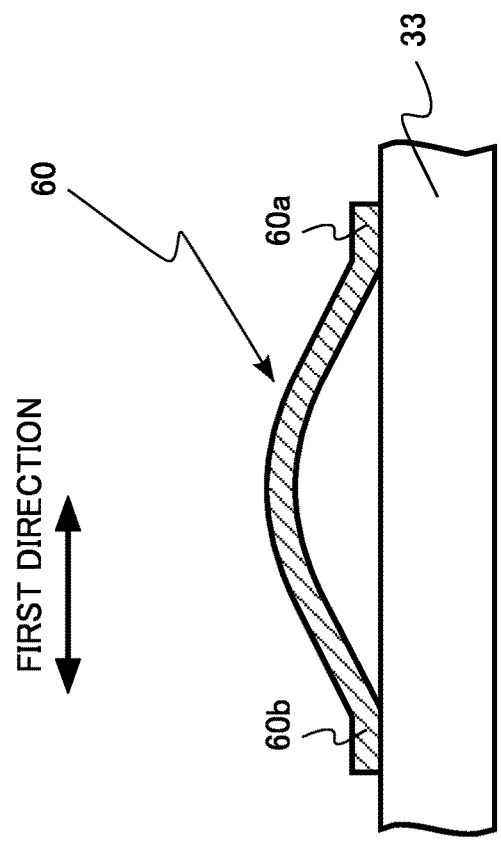
FIGS. 13A and 13B are schematic diagrams of a conductive member of the semiconductor device of the fifth embodiment.
Figure 13A:
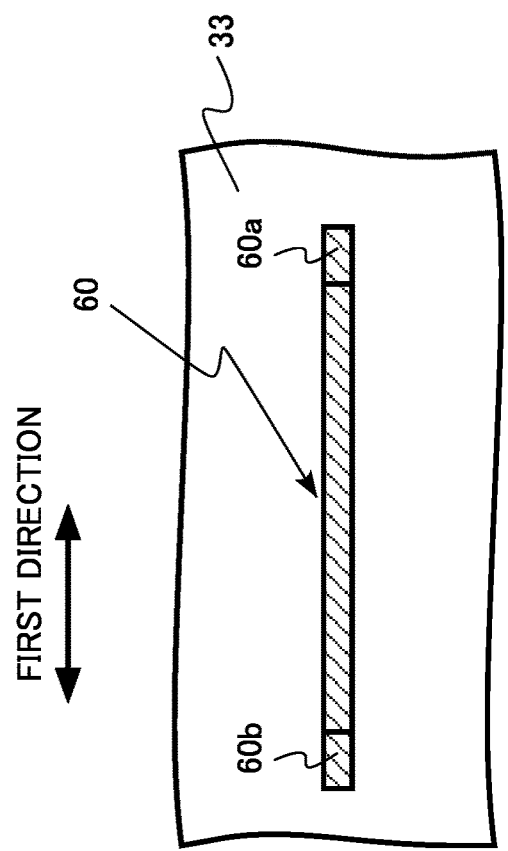

FIGS. 13A and 13B are schematic diagrams of a conductive member of the semiconductor device of the fifth embodiment. FIG. 13A is a top view, and FIG. 13B is a cross-sectional view. FIGS. 13A and 13B show the resistance-reducing bonding wire 60.

The resistance-reducing bonding wire 60 has a first portion 60a and a second portion 60b. The first portion 60a is disposed on the side of the negative terminal N, and the second portion 60b is disposed on the side of the AC output terminal AC. The first portion 60a and the second portion 60b are electrically connected to the third metal layer 33.

The resistance-reducing bonding wire 60 has a function of reducing the electrical resistance of the third metal layer 33.

The resistance-reducing bonding wire 60 is, for example, a metal. The resistance-reducing bonding wire 60 contains, for example, copper or aluminum. The resistance-reducing bonding wire 60 is formed of the same material as the third metal layer 33, for example.

In the power semiconductor module 500 of the fifth embodiment, the variation in the parasitic inductance of the wirings of the MOSFETs arranged in parallel is reduced by providing the slit 33x. Therefore, damage to the power semiconductor module 500 at the time of switching or the deterioration of reliability is suppressed. As a result, the switching loss of the power semiconductor module 500 is reduced.

From the viewpoint of reducing the variation in the parasitic inductance of the MOSFETs arranged in parallel, it is preferable that the third distance (d3 in FIG. 12) between the first end portion E1 and the slit 33x is smaller than the fourth distance (d4 in FIG. 12) between the slit 33x and the second end portion E2. The third distance d3 is preferably equal to or less than 80% of the fourth distance d4, more preferably equal to or less than 60% of the fourth distance d4.

From the viewpoint of reducing the variation in the parasitic inductance of the MOSFETs arranged in parallel, it is preferable that the length (L3 in FIG. 12) of the slit 33x in the first direction is larger than the length (L4 in FIG. 12) of the high side MOSFET 11 in the first direction. The length L3 of the slit 33x is preferably equal to or more than 120% of the length L4 of the high side MOSFET 11, more preferably equal to or more than 150% of the length L4 of the high side MOSFET 11.

In addition, in the power semiconductor module 500 of the fifth embodiment, the resistance-reducing bonding wire 60 is provided on the third metal layer 33. The resistance-reducing bonding wire 60 is provided between the slit 33x and the second end portion E2.

In the power semiconductor module 500 of the fifth embodiment, when there is no resistance-reducing bonding wire 60, the electrical resistance of the third metal layer 33 becomes higher than that in a case where the slit 33x is not provided by providing the slit 33x in the third metal layer 33. For this reason, for example, the electrical resistance of the current path from the positive terminal P to the AC output terminal AC may increase, and the steady loss of the power semiconductor module 500 may increase.

The power semiconductor module 500 of the fifth embodiment includes the resistance-reducing bonding wire 60. For this reason, the electrical resistance of the third metal layer 33 in a portion between the slit 33x and the second end portion E2 is reduced. Therefore, it is possible to reduce the steady loss.

As described above, according to the fifth embodiment, the switching loss of the power semiconductor module can be reduced by reducing the variation in the parasitic inductance of the power semiconductor chips arranged in parallel. In addition, the steady loss of the power semiconductor module can be reduced by reducing the electrical resistance of the current path.

Sixth Embodiment

A semiconductor device of a sixth embodiment is different from the semiconductor device of the fifth embodiment in that the conductive member is a bridge-shaped member. Hereinafter, the description of a part of the content overlapping the semiconductor device of the fifth embodiment may be omitted.

Figure 14:
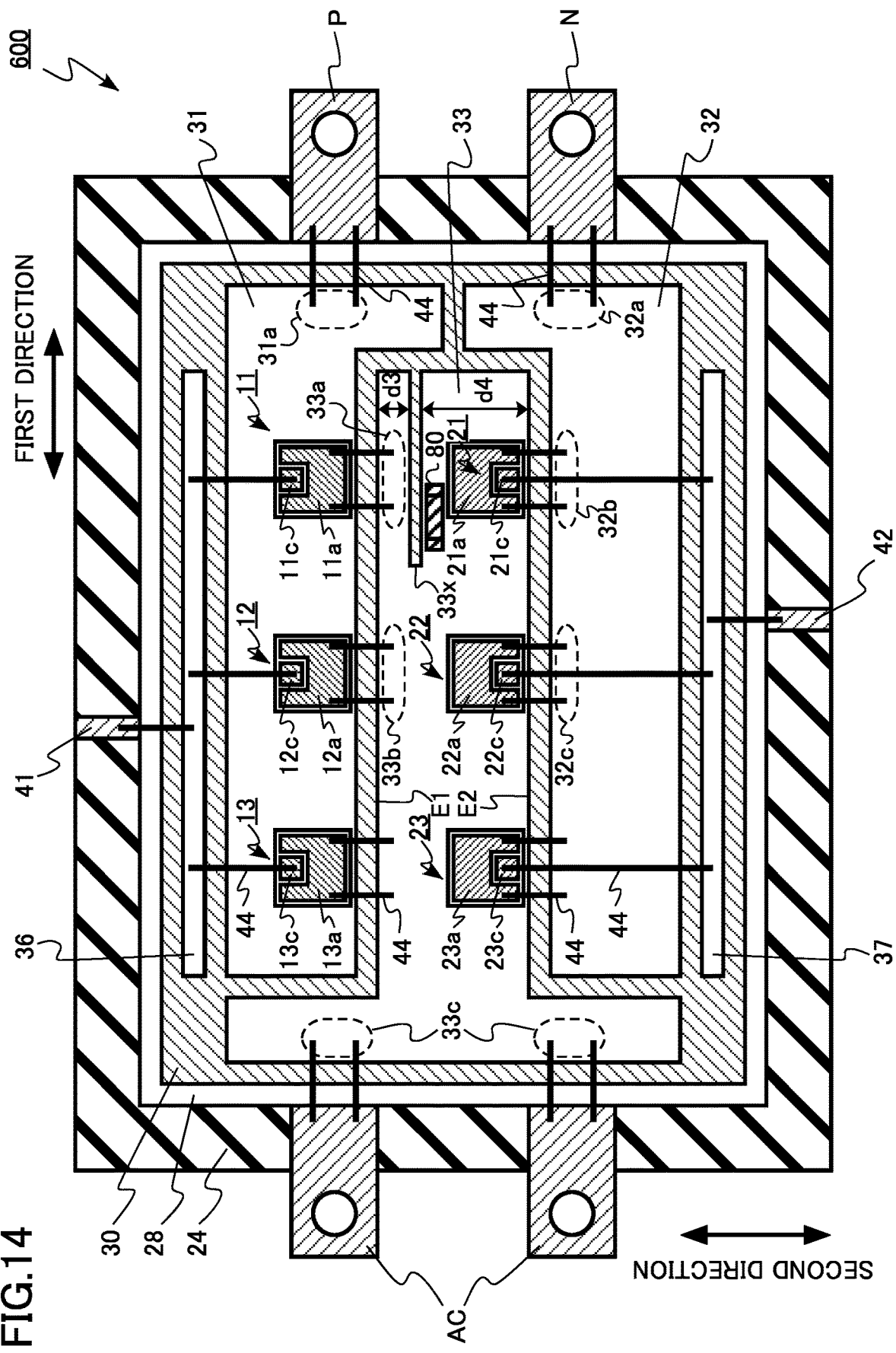
FIG. 14 is a schematic top view of a semiconductor device of a sixth embodiment.

FIG. 14 is a schematic top view of the semiconductor device of the sixth embodiment. FIG. 14 is a diagram corresponding to FIG. 12 of the fifth embodiment.

The semiconductor device of the sixth embodiment is a power semiconductor module 600. The power semiconductor module 600 of the sixth embodiment is a so-called "2in1" type module in which a half-bridge circuit can be configured by one module. In the power semiconductor module 600, three half-bridge units are connected in parallel to each other.

The power semiconductor module 600 includes a bridge-shaped member 80 (conductive member).

The bridge-shaped member 80 is provided between the slit 32x and the second end portion E2. The bridge-shaped member 80 extends in the first direction. One bridge-shaped member 80 is provided on the third metal layer 33.

Figure 15A:
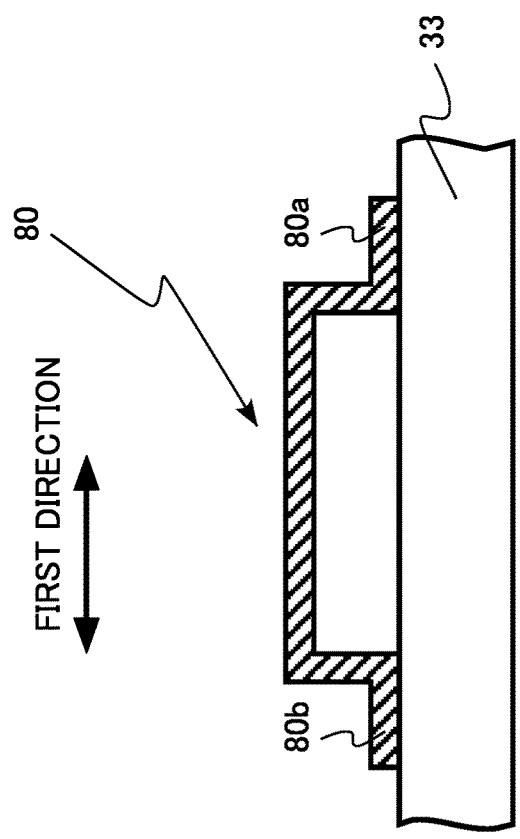
FIGS. 15A and 15B are schematic diagrams of a conductive member of the semiconductor device of the sixth embodiment.
Figure 15B:
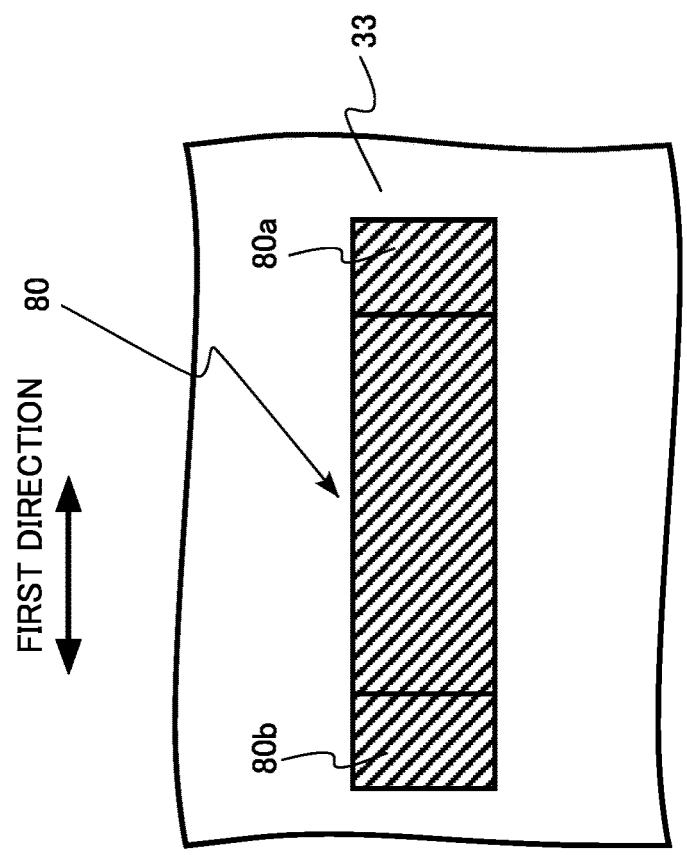

FIGS. 15A and 15B are schematic diagrams of a conductive member of the semiconductor device of the sixth embodiment. FIG. 15A is a top view, and FIG. 15B is a cross-sectional view. FIGS. 15A and 15B show the bridge-shaped member 80.

The bridge-shaped member 80 has a first portion 80a and a second portion 80b. The first portion 80a is disposed on the side of the negative terminal N, and the second portion 80b is disposed on the side of the AC output terminal AC.

The first portion 80a and the second portion 80b are electrically connected to the third metal layer 33. The first portion 80a and the second portion 80b are connected to the third metal layer 33 by, for example, a solder layer (not shown). The first portion 80a and the second portion 80b are connected to the third metal layer 33 by, for example, ultrasonic connection.

The bridge-shaped member 80 has a function of reducing the electrical resistance of the third metal layer 33.

The bridge-shaped member 80 is, for example, a metal. The bridge-shaped member 80 contains, for example, copper or aluminum. The bridge-shaped member 80 is formed of the same material as the third metal layer 33, for example.

As described above, according to the sixth embodiment, the switching loss of the power semiconductor module can be reduced by reducing the variation in the parasitic inductance of the power semiconductor chips arranged in parallel as in the fifth embodiment. In addition, as in the fifth embodiment, the steady loss of the power semiconductor module can be reduced by reducing the electrical resistance of the current path.

Seventh Embodiment

A semiconductor device of a seventh embodiment is different from the semiconductor device of the fifth embodiment in that the conductive member is a plate-shaped member. Hereinafter, the description of a part of the content overlapping the semiconductor device of the fifth embodiment may be omitted.

Figure 16:
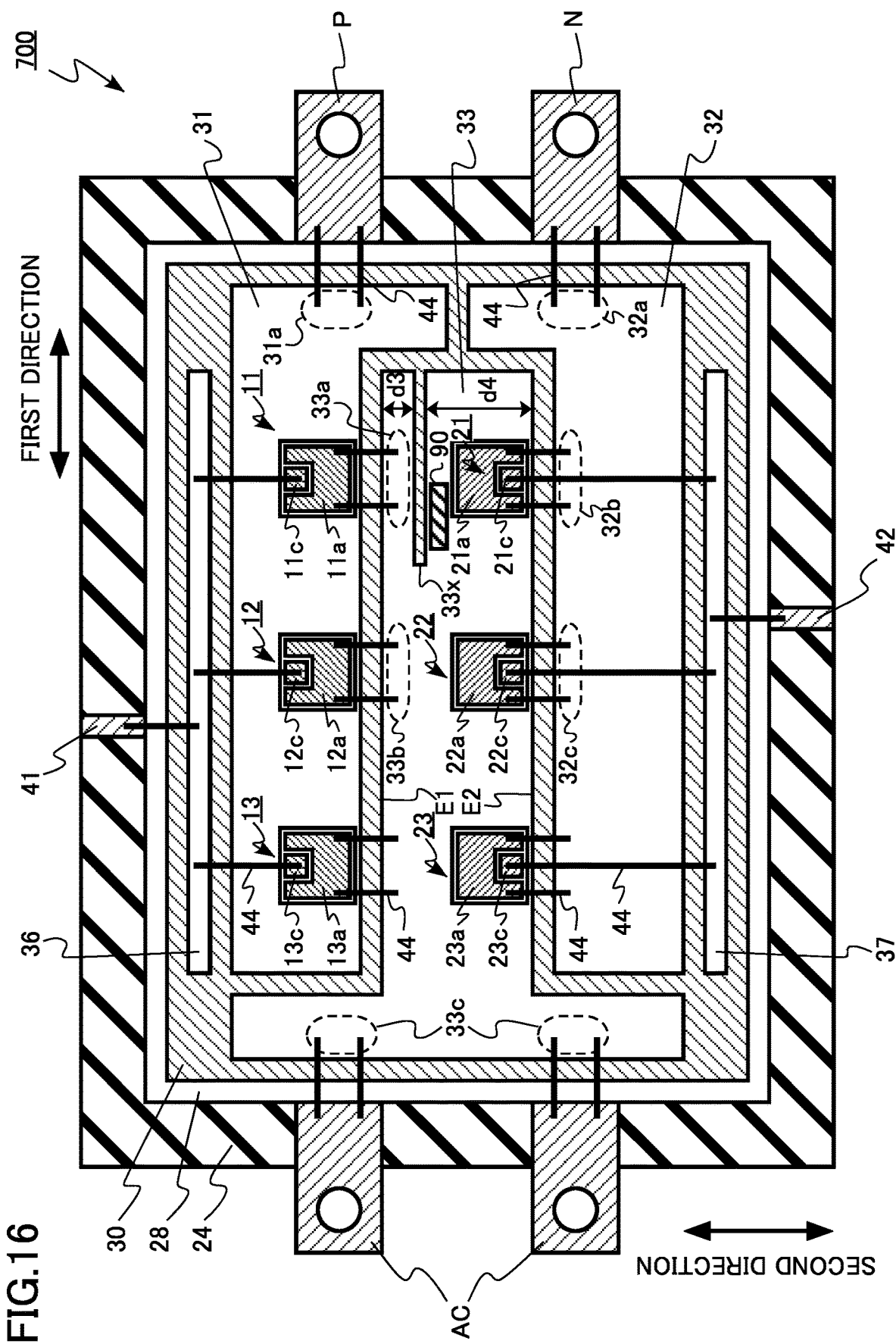
FIG. 16 is a schematic top view of a semiconductor device of a seventh embodiment.

FIG. 16 is a schematic top view of the semiconductor device of the seventh embodiment. FIG. 16 is a diagram corresponding to FIG. 12 of the fifth embodiment.

The semiconductor device of the seventh embodiment is a power semiconductor module 700. The power semiconductor module 700 of the seventh embodiment is a so-called "2in1" type module in which a half-bridge circuit can be configured by one module. In the power semiconductor module 700, three half-bridge units are connected in parallel to each other.

The power semiconductor module 700 includes a plate-shaped member 90 (conductive member).

The plate-shaped member 90 is provided between the slit 33x and the second end portion E2. The plate-shaped member 90 extends in the first direction. For example, one plate-shaped member 90 is provided in the first direction on the third metal layer 33.

Figure 17A:
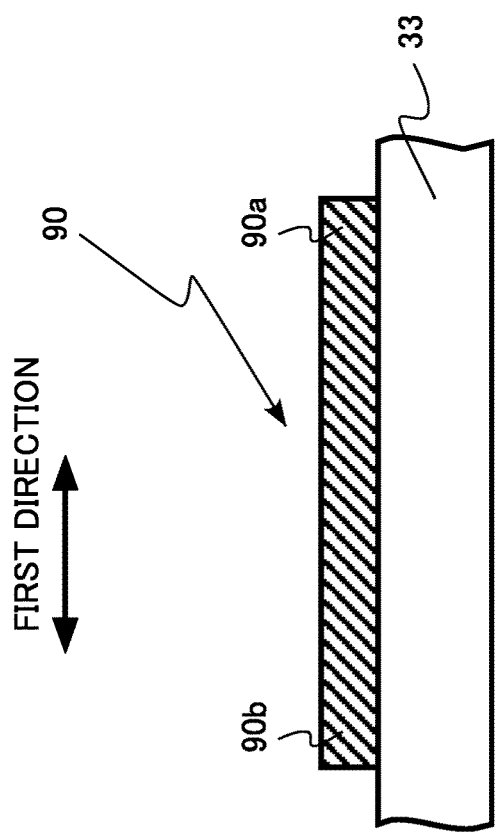
FIGS. 17A and 17B are schematic diagrams of a conductive member of the semiconductor device of the seventh embodiment.
Figure 17B:
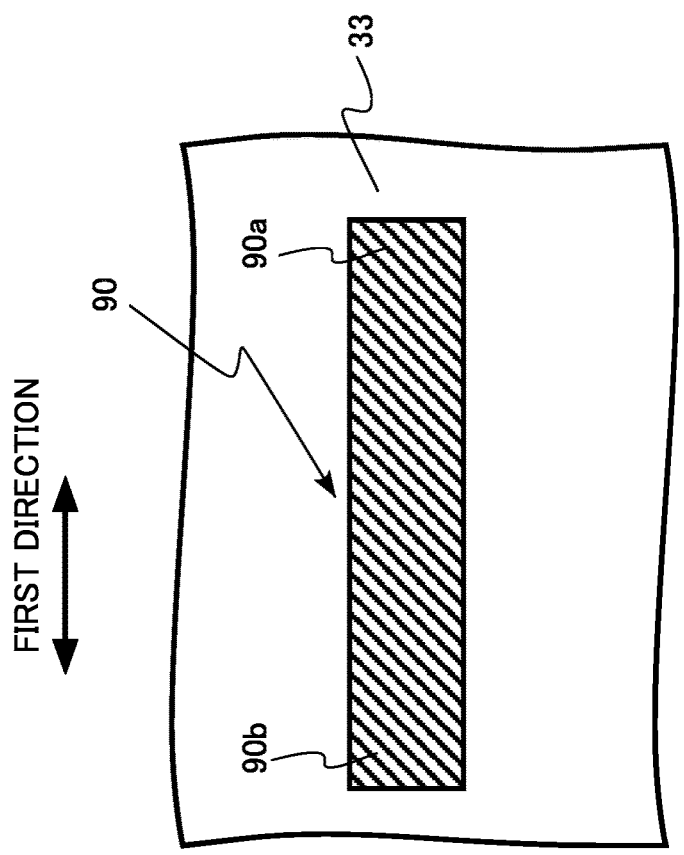

FIGS. 17A and 17B are schematic diagrams of a conductive member of the semiconductor device of the seventh embodiment. FIG. 17A is a top view, and FIG. 17B is a cross-sectional view. FIGS. 17A and 17B show the plate-shaped member 90.

The plate-shaped member 90 has a first portion 90a and a second portion 90b. The first portion 90a is disposed on the side of the negative terminal N, and the second portion 90b is disposed on the side of the AC output terminal AC.

The entire lower surface of the plate-shaped member 90 including the first portion 90a and the second portion 90b is electrically connected to the third metal layer 33. The plate-shaped member 90 is connected to the third metal layer 33 by, for example, a solder layer (not shown). The plate-shaped member 90 is connected to the third metal layer 33 by, for example, ultrasonic connection.

The plate-shaped member 90 has a function of reducing the electrical resistance of the third metal layer 33.

The plate-shaped member 90 is, for example, a metal. The plate-shaped member 90 contains, for example, copper or aluminum. The plate-shaped member 90 is formed of the same material as the third metal layer 33, for example.

As described above, according to the seventh embodiment, the switching loss of the power semiconductor module can be reduced by reducing the variation in the parasitic inductance of the power semiconductor chips arranged in parallel as in the fifth embodiment. In addition, as in the fifth embodiment, the steady loss of the power semiconductor module can be reduced by reducing the electrical resistance of the current path.

Eighth Embodiment

A semiconductor device of an eighth embodiment is different from the semiconductor device of the fifth embodiment in that a conductive member is also provided between the slit and the first end portion. Hereinafter, the description of a part of the content overlapping the semiconductor device of the fifth embodiment may be omitted.

Figure 18:
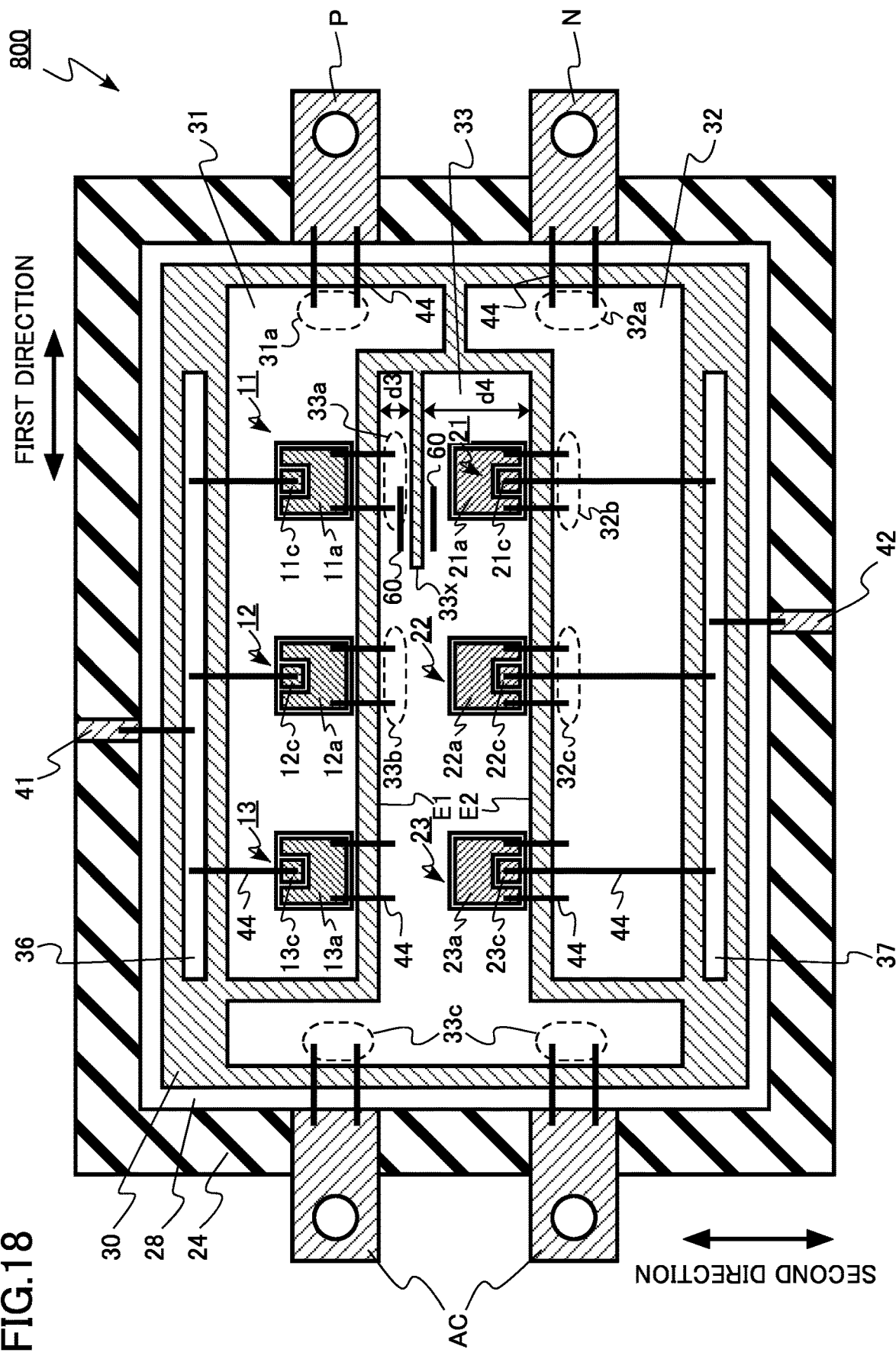
FIG. 18 is a schematic top view of a semiconductor device of an eighth embodiment.

FIG. 18 is a schematic top view of the semiconductor device of the eighth embodiment. FIG. 18 is a diagram corresponding to FIG. 12 of the fifth embodiment.

The semiconductor device of the eighth embodiment is a power semiconductor module 800. The power semiconductor module 800 of the eighth embodiment is a so-called "2in1" type module in which a half-bridge circuit can be configured by one module. In the power semiconductor module 800, three half-bridge units are connected in parallel to each other.

The power semiconductor module 800 includes the resistance-reducing bonding wire 60 (conductive member).

The resistance-reducing bonding wire 60 is provided between the slit 33x and the second end portion E2. The resistance-reducing bonding wire 60 extends in the first direction. For example, one resistance-reducing bonding wire 60 is provided on the third metal layer 33 between the slit 33x and the second end portion E2.

The resistance-reducing bonding wire 60 is also provided between the slit 33x and the first end portion E1. The resistance-reducing bonding wire 60 extends in the first direction. For example, one resistance-reducing bonding wire 60 is provided on the third metal layer 33 between the slit 33x and the first end portion E1.

The power semiconductor module 800 of the eighth embodiment includes the resistance-reducing bonding wire 60. For this reason, the electrical resistance of the third metal layer 33 in a portion between the slit 33x and the second end portion E2 and a portion between the slit 33x and the first end portion E1 is reduced. Therefore, it is possible to further reduce the steady loss as compared with the fifth embodiment.

In addition, it is also possible to provide the resistance-reducing bonding wire 60 only in the portion between the slit 33x and the first end portion E1.

As described above, according to the eighth embodiment, the switching loss of the power semiconductor module can be reduced by reducing the variation in the parasitic inductance of the power semiconductor chips arranged in parallel as in the fifth embodiment. In addition, the steady loss of the power semiconductor module can be reduced by reducing the electrical resistance of the current path.

In the first to eighth embodiments, the case where a slit is provided in either one of the second metal layer 32 and the third metal layer 33 has been described as an example. However, a slit may be provided in both of the second metal layer 32 and the third metal layer 33. In this case, a conductive member may be provided on both the second metal layer 32 and the third metal layer 33.

In the first to eighth embodiments, the case where the MOSFET is used as a semiconductor chip has been described as an example. However, the power semiconductor chip is not limited to the MOSFET. For example, other transistors such as IGBTs can be applied as power semiconductor chips. In addition, as a power semiconductor chip, for example, a MOSFET without a built-in SBD can be applied.

In the first to eighth embodiments, the case where the number of power semiconductor chips arranged in parallel is three has been described as an example. However, the number of power semiconductor chips may be two or may be equal to or more than four.

In the first to eighth embodiments, the case where the power semiconductor module is a "2in1" type module has been described as an example. However, the power semiconductor module may have other circuit configurations such as a "4in1" type or a "6in1" type, for example.

In the first to eighth embodiments, the case where the power semiconductor chip is formed by using silicon carbide (SiC) has been described as an example. However, the power semiconductor chip may be a power semiconductor chip formed by using other semiconductors such as silicon or gallium nitride, for example.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
an insulating substrate having one end and the other end on a side opposite to the one end; a first main terminal provided on a side of the one end;
a second main terminal provided on the side of the one end;
an output terminal provided on a side of the other end;
a first metal layer provided on the insulating substrate, the first metal layer having a first region, and electrically connected to the first main terminal in the first region;
a second metal layer provided on the insulating substrate, the second metal layer having a second region, a third region, and a fourth region, and electrically connected to the second main terminal in the second region;
a third metal layer provided on the insulating substrate, the third metal layer disposed between the first metal layer and the second metal layer, the third metal layer having a fifth region, a sixth region, and a seventh region, and electrically connected to the output terminal in the seventh region;
a first semiconductor chip including a first upper electrode, a first lower electrode, and a first gate electrode and provided on the first metal layer, the first upper electrode being electrically connected to the fifth region and the first lower electrode being electrically connected to the first metal layer;
a second semiconductor chip including a second upper electrode, a second lower electrode, and a second gate electrode and provided on the first metal layer, the second upper electrode being electrically connected to the sixth region, the second lower electrode being electrically connected to the first metal layer, and a distance of the second semiconductor chip from the first region being longer than a distance of the first semiconductor chip from the first region;
a third semiconductor chip including a third upper electrode, a third lower electrode, and a third gate electrode and provided on the third metal layer, the third upper electrode being electrically connected to the third region and the third lower electrode being electrically connected to the third metal layer;

a fourth semiconductor chip including a fourth upper electrode, a fourth lower electrode, and a fourth gate electrode and provided on the third metal layer, the fourth upper electrode being electrically connected to the fourth region, the fourth lower electrode being electrically connected to the third metal layer, and a distance of the fourth semiconductor chip from the fifth region being longer than a distance of the third semiconductor chip from the fifth region; and a conductive member, at least a first portion on a side of the second main terminal and a second portion on a side of the output terminal being electrically connected to the second metal layer, wherein the second metal layer has a first end portion on a side facing the third metal layer and a second end portion on a side opposite to the first end portion and includes a slit disposed between the third region and the second end portion, and the conductive member is provided at a position at least between the slit and the first end portion or between the slit and the second end portion.

2. The semiconductor device according to claim 1, wherein the conductive member is a bonding wire.

3. The semiconductor device according to claim 1, wherein the conductive member is a plate-shaped member.

4. The semiconductor device according to claim 1, wherein the conductive member and the second metal layer are formed of the same material.

5. The semiconductor device according to claim 1, wherein a first distance between the first end portion and the slit is shorter than a second distance between the slit and the second end portion.

6. A semiconductor device, comprising:

an insulating substrate having one end and the other end on a side opposite to the one end;

a first main terminal provided on a side of the one end;

a second main terminal provided on the side of the one end;

an output terminal provided on a side of the other end;

a first metal layer provided on the insulating substrate, the first metal layer having a first region, and electrically connected to the first main terminal in the first region;

a second metal layer provided on the insulating substrate, the second metal layer having a second region, a third region, and a fourth region, and electrically connected to the second main terminal in the second region;

a third metal layer provided on the insulating substrate, the third metal layer disposed between the first metal layer and the second metal layer, the third metal layer having a fifth region, a sixth region, and a seventh region, and electrically connected to the output terminal in the seventh region;

a first semiconductor chip including a first upper electrode, a first lower electrode, and a first gate electrode and provided on the first metal layer, the first upper electrode being electrically connected to the fifth region and the first lower electrode being electrically connected to the first metal layer;

a second semiconductor chip including a second upper electrode, a second lower electrode, and a second gate electrode and provided on the first metal layer, the second upper electrode being electrically connected to the sixth region, the second lower electrode being electrically connected to the first metal layer, and a distance of the second semiconductor chip from the first region being longer than a distance of the first semiconductor chip from the first region;

a third semiconductor chip including a third upper electrode, a third lower electrode, and a third gate electrode and provided on the third metal layer, the third upper electrode being electrically connected to the third region and the third lower electrode being electrically connected to the third metal layer;

a fourth semiconductor chip including a fourth upper electrode, a fourth lower electrode, and a fourth gate electrode and provided on the third metal layer, the fourth upper electrode being electrically connected to the fourth region, the fourth lower electrode being electrically connected to the third metal layer, and a distance of the fourth semiconductor chip from the fifth region being longer than a distance of the third semiconductor chip from the fifth region; and a conductive member, at least a first portion on a side of the second main terminal and a second portion on a side of the output terminal being electrically connected to the third metal layer, wherein the third metal layer has a first end portion on a side facing the first metal layer and a second end portion on a side opposite to the first end portion and includes a slit disposed between the fifth region and the second end portion, and the conductive member is provided at a position at least between the slit and the first end portion or between the slit and the second end portion.

7. The semiconductor device according to claim 6, wherein the conductive member is a bonding wire.

8. The semiconductor device according to claim 6, wherein the conductive member is a plate-shaped member.

9. The semiconductor device according to claim 6, wherein the conductive member and the third metal layer are formed of the same material.

10. The semiconductor device according to claim 6, wherein a third distance between the first end portion and the slit is shorter than a fourth distance between the slit and the third end portion.

* * * * *